United States Patent
Hillman et al.

(10) Patent No.: US 10,537,031 B2
(45) Date of Patent: Jan. 14, 2020

(54) REFLOW SOLDERING APPARATUS, SYSTEM AND METHOD

(71) Applicant: Service Support Specialties, Inc., Montville, NJ (US)

(72) Inventors: Gary Hillman, Livingston, NJ (US); Joseph Deghuee, Ridgeland, SC (US)

(73) Assignee: SERVICE SUPPORT SPECIALTIES, INC., Montville, NJ (US)

( * ) Notice: Subject to any disclaimer, the term of this patent is extended or adjusted under 35 U.S.C. 154(b) by 0 days.

(21) Appl. No.: 15/927,179

(22) Filed: Mar. 21, 2018

(65) Prior Publication Data

US 2018/0279485 A1 Sep. 27, 2018

Related U.S. Application Data

(60) Provisional application No. 62/474,998, filed on Mar. 22, 2017.

(51) Int. Cl.

| | |
|---|---|
| B23K 1/00 | (2006.01) |
| H05K 3/34 | (2006.01) |
| H01L 21/67 | (2006.01) |
| B23K 3/04 | (2006.01) |
| B23K 1/008 | (2006.01) |
| B23K 35/38 | (2006.01) |
| B23K 101/40 | (2006.01) |

(52) U.S. Cl.
CPC ........... *H05K 3/3494* (2013.01); *B23K 1/008* (2013.01); *B23K 3/04* (2013.01); *B23K 35/383* (2013.01); *H01L 21/6719* (2013.01); *H01L 21/67109* (2013.01); *H01L 21/67144* (2013.01); *H01L 21/67207* (2013.01); *B23K 2101/40* (2018.08)

(58) Field of Classification Search
CPC ......... B23K 1/008; B23K 1/005; B23K 1/002
See application file for complete search history.

(56) References Cited

U.S. PATENT DOCUMENTS

| | | |
|---|---|---|
| 3,576,969 A | 5/1971 | Surty et al. |
| 4,238,111 A * | 12/1980 | Norman ................... F16K 3/184 251/193 |
| 4,847,465 A | 7/1989 | Toyama et al. |
| 5,163,599 A | 11/1992 | Mishina et al. |
| 5,193,735 A | 3/1993 | Knight |
| 5,433,368 A | 7/1995 | Spigarelli |

(Continued)

*Primary Examiner* — Erin B Saad
(74) *Attorney, Agent, or Firm* — The Belles Group, P.C.

(57) ABSTRACT

A reflow soldering apparatus, system, and method. The reflow soldering system may include a housing that is alterable between an open state and a closed state, the open state being used for loading and unloading of substrates and the closed state being used during operation. The system may also include a heating assembly located within the chamber and a cooling assembly that is spaced apart from the heating assembly. A support member may be included to support a substrate within the chamber. A first actuator unit may be operably coupled to either the heating and cooling assemblies jointly, or to the support member. Additionally, the system may include a control unit coupled to the first actuator unit to cause relative movement between the substrate and the heating and cooling assemblies. Thus, the substrate can move between the heating and cooling assemblies during the various stages of the reflow soldering process.

18 Claims, 13 Drawing Sheets

(56) References Cited

U.S. PATENT DOCUMENTS

| | | | |
|---|---|---|---|
| 5,440,101 A | 8/1995 | Cox et al. | |
| 5,560,531 A | 10/1996 | Ruszowski | |
| 5,573,174 A | 11/1996 | Pekol | |
| 5,623,829 A | 4/1997 | Nutter et al. | |
| 5,791,895 A * | 8/1998 | Kyung | C30B 31/14 118/503 |
| 6,344,407 B1 * | 2/2002 | Matsuki | B23K 35/38 228/180.22 |
| 6,354,481 B1 | 3/2002 | Rich et al. | |
| 6,644,536 B2 | 11/2003 | Ratificar et al. | |
| 6,936,793 B1 | 8/2005 | Shiloh et al. | |
| 2002/0130164 A1 * | 9/2002 | Matsuki | B23K 1/008 228/206 |
| 2002/0146657 A1 | 10/2002 | Anderson et al. | |
| 2006/0124705 A1 | 6/2006 | Kuczynski et al. | |
| 2009/0206145 A1 * | 8/2009 | Tamori | B23K 1/008 228/15.1 |
| 2015/0034699 A1 | 2/2015 | Zhang | |
| 2015/0034700 A1 | 2/2015 | Zhang | |
| 2015/0034702 A1 | 2/2015 | Zhang | |
| 2015/0090768 A1 * | 4/2015 | Kuroda | B23K 1/005 228/46 |
| 2016/0143155 A1 | 5/2016 | Zhang | |
| 2016/0143156 A1 | 5/2016 | Zhang | |
| 2016/0233191 A1 | 8/2016 | Zhang et al. | |
| 2016/0336293 A1 | 11/2016 | Zhang et al. | |

* cited by examiner though the assembly is subjected to controlled heat, which melts the solder and permanently connects the electrical components to the substrate. Reflow soldering is used to simultaneously couple several electrical components to a common substrate. Reflow soldering is generally a four-stage process that includes a preheat stage, a thermal soak stage, a reflow stage, and a cooling stage.

REFLOW SOLDERING APPARATUS, SYSTEM AND METHOD

CROSS-REFERENCE TO RELATED APPLICATIONS

The present application claims priority to U.S. Provisional Patent Application Ser. No. 62/474,998, filed Mar. 22, 2017, the entirety of which is incorporated herein by reference.

BACKGROUND

Reflow soldering is a process in which a solder paste is used to attach one or several electrical components to a substrate. Specifically, a solder paste is used to temporarily attach the electrical components to contact pads of the substrate, after which the assembly is subjected to controlled heat, which melts the solder and permanently connects the electrical components to the substrate. Reflow soldering is used to simultaneously couple several electrical components to a common substrate. Reflow soldering is generally a four-stage process that includes a preheat stage, a thermal soak stage, a reflow stage, and a cooling stage.

In known systems that are used for reflow soldering, the substrate assembly is formed from a substrate and electrical components temporarily coupled thereto with a solder paste. The substrate assembly is placed on a conveyor that passes through an oven that heats and cools the substrate assembly to achieve the reflow soldering necessary to attach the electrical components to the substrate. Such systems have generally been effective at achieving the necessary rapid cooling by transporting the substrate by the conveyor from a heated zone to a cooler zone thereby creating a temperature spike that controls important mechanical properties of the solidified solder. However, these prior art conveyor-type solder reflow systems suffer from many deficiencies, including high expense due to: (1) the need for many robots or personnel to operate the system; and (2) the need for a high flow rate of Nitrogen to maintain the relatively low oxygen content in the conveyor oven ambient atmosphere because the conveyor oven must be open on both ends. Furthermore, the conveyorized oven generates particulate material due to the motion between the belt and the oven floor, thus requiring that the conveyorized oven be located in a "dirty" environment, which necessitates back-and-forth movement of the substrate between the conveyorized oven to a clean area of the semiconductor facility Thus, a need exists for a reflow soldering system and method that overcomes the deficiencies in the prior art. Specifically, a need exists for a low-cost alternative to the reflow soldering systems that are currently available that reduces cost, equipment footprint, and complexity.

BRIEF SUMMARY

The present invention is directed to a reflow soldering apparatus, system, and method. The reflow soldering system may include a housing that is alterable between an open state and a closed state, the open state being used for loading and unloading of substrates and the closed state being used during operation. The system may also include a heating assembly located within the chamber and a cooling assembly that is spaced apart from the heating assembly. A support member may be included to support a substrate within the chamber. A first actuator unit may be operably coupled to either the heating and cooling assemblies jointly, or to the support member. Additionally, the system may include a control unit coupled to the first actuator unit to cause relative movement between the substrate and the heating and cooling assemblies. Thus, the substrate can move between the heating and cooling assemblies during the various stages of the reflow soldering process.

In one aspect, the invention may be a reflow soldering system comprising: a housing comprising a first member and a second member that are alterable between: (1) a closed state in which the first and second members of the housing collectively define a chamber; and (2) an open state in which a passageway is formed into the chamber for loading and unloading substrates from the chamber; a heating assembly located within the chamber; a cooling assembly spaced apart from the heating assembly; a support member configured to support a substrate within the chamber; a first actuator unit operably coupled to: (1) the heating assembly and the cooling assembly; or (2) the support member; and a control unit operably coupled to the first actuator unit to cause relative movement between a substrate supported by the support member and the heating and cooling assemblies using the first actuator unit.

In another aspect, the invention may be reflow soldering system comprising: a housing comprising a first member and a second member, the second member alterable between: (1) a closed state in which the first and second members of the housing collectively define a chamber that extends from a bottom end to a top end along a longitudinal axis; and (2) an open state in which a passageway is formed into the chamber for loading and unloading substrates from the chamber; a heating assembly located within the chamber; a cooling assembly axially spaced apart from the heating assembly; a support member configured to support a substrate within the chamber; a first actuator unit operably coupled to the support member; and a control unit operably coupled to the first actuator unit to move the support member relative to the heating and cooling assemblies in opposite directions parallel to the longitudinal axis using the first actuator unit.

In yet another aspect, the invention may be a reflow soldering method comprising: a) providing a housing comprising a first member and a second member that collectively define a chamber that extends along a longitudinal axis, wherein a heating assembly is located within the chamber and a cooling assembly is axially spaced apart from the heating assembly; b) moving the second member of the housing relative to the first member of the housing to form a passageway into the chamber; c) inserting a substrate into the chamber of the housing so that the substrate is located axially between the heating assembly and the cooling assembly; d) moving the second member of the housing relative to the first member of the housing to close the chamber; and e) with the chamber closed, performing a solder reflow operation on the substrate, wherein the solder reflow operation comprises modifying a relative position between the substrate and the heating and cooling assemblies by: (1) moving the heating and cooling assemblies in a direction parallel to the longitudinal axis while the substrate remains static; or (2) moving the substrate in a direction parallel to the longitudinal axis while the heating and cooling assemblies remain static.

In still another aspect, the invention may be a reflow soldering method comprising: a) providing a housing defining a chamber that extends along a longitudinal axis, wherein a heating assembly is located within the chamber and a cooling assembly is axially spaced apart from the heating assembly; b) inserting a substrate into the chamber of the housing; and c) performing a solder reflow operation on the substrate, the solder reflow operation comprising:

c-1) heating the substrate within the chamber at a first temperature for a first pre-determined period of time; and c-2) after expiration of the first pre-determined period of time, cooling the substrate within the chamber at a second temperature for a second pre-determined period of time; and wherein during step c-1) the substrate is located within the chamber and positioned adjacent to the heating assembly and during step c-2) the substrate is located in the chamber and positioned adjacent to the cooling assembly.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

Figure 1A:
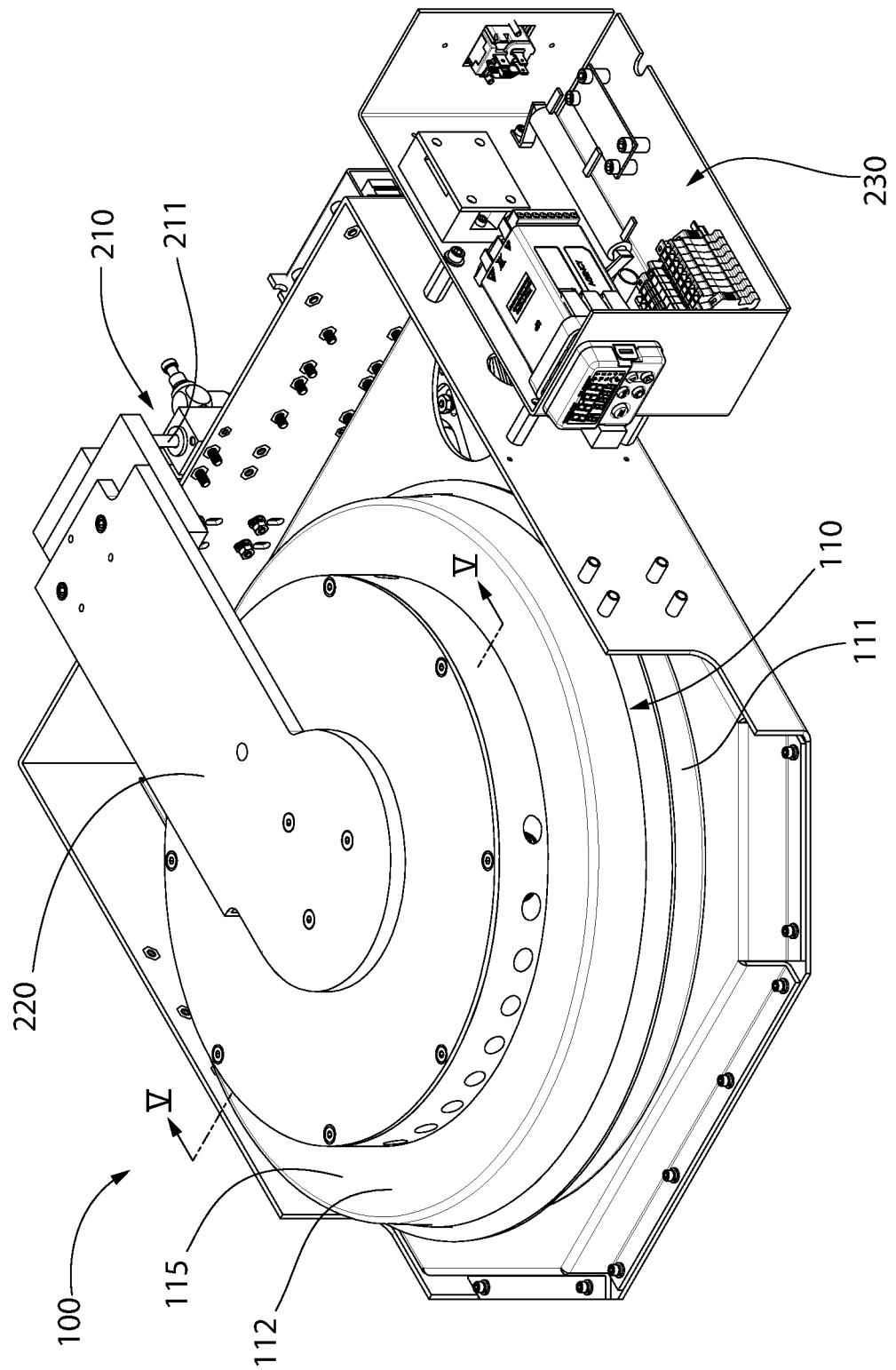
FIG. 1A is a perspective view of a reflow soldering system in accordance with an embodiment of the present invention, wherein a housing of the system is in a closed state.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Referring to FIGS. 1A-3 concurrently, a reflow soldering system 100 will be described in accordance with an embodiment of the present invention. The reflow soldering system 100 is designed to achieve an effective reflow soldering process in a singular chamber without the use of a conveyor belt. Rather, during reflow soldering using the reflow soldering system 100, a substrate is subjected to heating and cooling within a singular chamber. In some embodiments, the substrate may move upwardly and downwardly within the chamber, but the substrate does not move horizontally such as it would if it were placed on a conveyor belt.

Some advantages/benefits achieved with the system 100 include reducing cost and complexity of solder reflow processing systems by completely eliminating the conveyorized reflow oven. This eliminates the need for multiple robotic handling systems at either end of such an oven. Only one handling system is required since the substrate no longer needs to proceed a great distance to properly undergo the requisite thermal excursion. The system 100 may also minimize Nitrogen consumption by providing for a heating enclosure wherein the heating excursion occurs in a limited vertical direction and the heating enclosure is not open on either end but can be exhausted in a single direction. The system also has no relative motion of sliding belts which eliminates the production of unwanted particulate contaminants so that the processing system may be conveniently placed within clean semiconductor processing environments. The system 100 has a reduced footprint thereby minimizing costs. The system 100 improves control of crystallized solder structure by providing improved control of cooling rates from the liquid to the solid state of the solder as it cools from the reflow operation. Finally, the system 100 provides an enclosed chamber environment to enable the use of additional chemistries to be effectively employed such as the inclusion of Formic acid in the atmospheric environment of the heating chamber at minimum cost and complexity.

The reflow soldering system 100 generally comprises a housing 110, a heating assembly 130, a cooling assembly 150, a support member 170, a first actuator unit 190, a second actuator unit 210, and a control unit 230. The control unit 230 is operably coupled to the first and second actuator units 190, 210 to control operation thereof and to the heating assembly 130 and the cooling assembly 150, or portions thereof, as described in more detail below. The control unit 230 is also operably coupled to other components of the reflow soldering system 100 as described herein and illustrated in FIG. 9.

Figure 1B:
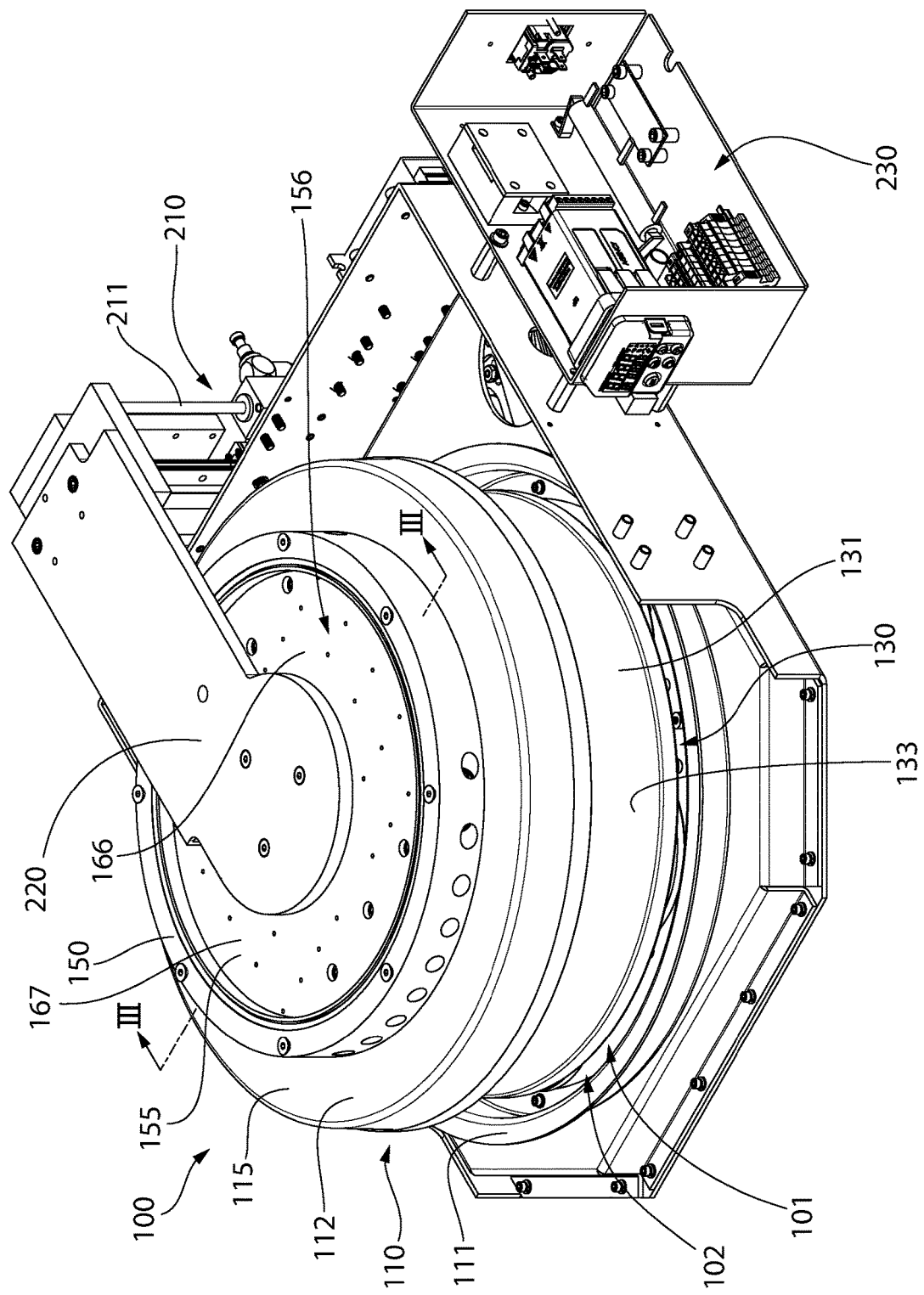
FIG. 1B is a perspective view of the reflow soldering system of FIG. 1A, wherein the housing of the system is in an open state

The housing 110 comprises a chamber 101. Moreover, the housing 110 is alterable between (1) an open state in which a passageway 102 into the chamber 101 is formed for loading and unloading substrates from the chamber 101; and (2) a closed state in which the passageway 102 is closed. In the exemplified embodiment, the housing 110 comprises a first member 111 and a second member 112. The first member 111 may be considered a body of the housing 110 and the second member 112 may be considered a lid of the housing 110 in some embodiments. In the exemplified embodiment, the housing 110 is alterable between the open and closed states by moving at least one of the first and second members 111, 112 relative to the other. Specifically, in the closed state, as shown in FIG. 1A, the first and second members 111, 112 of the housing 110 are in contact with one another to collectively define the chamber 101; and in the open state, as shown in FIG. 1B, the first and second members 111, 112 are spaced apart from one another and the passageway 102 into the chamber 101 is formed for loading and unloading substrates from the chamber 101. The second member 112 may have a gasket 104 that contacts the first member 111 when the housing 110 is in the closed state to effectively seal the chamber 101. Of course, the gasket may be coupled to the first member 111 instead of to the second member 112 in other embodiments or the gasket may be omitted as it may not be required to form the sealed chamber 101.

In the exemplified embodiment, the second member 112 moves upwardly and downwardly relative to the first member 111 of the housing 110 to alter the housing 110 between the open and closed states. However, in other embodiments the second member 112 may be hingedly coupled to the first member 111 so that the second member 112 is pivoted between the open and closed states. In still other embodiments, the first member 111 may move relative to the second member 112 or both of the first and second members 111, 112 may move to alter the housing 110 between the open and closed states. The second member 112 may also be a slidable lid or the like rather than being lifted upwardly and away from the first member 111 to transition into the open state. The housing 110 may comprise a body portion and a door or cover portion that is movable relative to the body portion to alter the housing 110 between the open and closed states in any desired manner.

Furthermore, in an alternate embodiment, the housing 110 may be a closed structure having a slot-like opening therein providing a passageway into the chamber 101. In such an embodiment, the housing 110 may not be alterable between open and closed states, but rather it may always have the slot-like opening that provides a passageway into the chamber 101 for loading and unloading substrates from the chamber 101. In such an embodiment, during operation there may be a gaseous barrier (the gas being Nitrogen or the like) along the slot-like opening to "close" the slot-like opening. Thus, although the slot-like opening may always exist as an opening, the gaseous barrier will functionally seal the slot-like opening from the ambient.

In the exemplified embodiment, the housing is alterable from the open state to the closed state using the second actuator unit 210. The second actuator unit 210 generally comprises a piston element 211 that is alterable between: (1) a retracted state (FIG. 1A) in which the piston element 211 is retracted and allows the first and second members 111, 112 to contact one another and achieve the closed state; and (2) an extended state (FIG. 1B) in which the piston element 211 is extended, thereby creating relative movement between the first and second members 111, 112 to achieve the open state. In the exemplified embodiment, the piston element 211 is coupled to the second member 112 of the housing 110 so that as the piston element 211 is altered from the retracted state to the extended state, it forces the second member 112 of the housing 110 to move relative to the first member 111 of the housing 110. More specifically, in the exemplified embodiment the piston element 211 is coupled to an arm member 220 and the arm member 220 is also coupled to the second member 112. Thus, as the piston element 211 engages the arm member 220, it moves the entirety of the second member 112 along with the arm member 220. However, the invention is not to be so limited and the piston element 211 may instead be coupled to the first member 111 of the housing 110. Furthermore, as noted above, the second member 112 may be coupled to the first member 111 by a hinge or in any other manner and the manner in which they are coupled will dictate the exact manner that they are altered between the open and closed states.

The second actuator unit 210 may be a pneumatic actuator, a solenoid, or any other type of actuator capable of achieving the desired relative movement between the first and second members 111, 112. For example, in one embodiment the second actuator unit 210 may be a dedicated motor and belt and pulley system that is configured to move the second member 112 without also moving the first member 111 in order to form the open/closed states.

As noted above, the second actuator unit 210 is operably coupled to the control unit 230 so that the control unit 230 may control activation of the second actuator unit 210. Specifically, based on algorithms pre-stored in the control unit 230, the control unit 230 will activate the second actuator unit 210 at such time as it determines that the housing 110 should be altered from the open state to the closed state or vice versa. The second actuator unit 210 may also be coupled to any other components needed for operation of the second actuator unit 210, such as for example without limitation a source of compressed air when the second actuator unit 210 is a pneumatic actuator.

The first member 111 comprises an inner surface 113 and the second member 112 comprises an inner surface 114 such that the inner surfaces 113, 114 of the first and second members 111, 112 collectively define the chamber 101 when in the closed state. The second member 112 comprises an outer surface 115 that is opposite the inner surface 114. As discussed in greater detail below, in the exemplified embodiment the cooling assembly 150 is coupled to the outer surface 115 of the second member 112 of the housing 110, although the cooling assembly 150 may be coupled to other portions of the housing 110 in other embodiments.

In the exemplified embodiment, each of the first and second members 111, 112 of the housing 110 are circular in shape, but the invention is not to be limited by the shape of the housing 110 and its component parts in all embodiments. Moreover, in the exemplified embodiment the chamber 101 is sized and configured to receive a single substrate at a time so that only one substrate can undergo the reflow soldering process at a time using the reflow soldering system 100.

However, the invention is not to be so limited and the size and shape of the housing 110 and therefore also of the chamber 101 may be modified so that the chamber 101 can accept multiple substrates at a time for simultaneous processing. By modifying the shape and/or size of the components of the system 100 (specifically, of the housing 110, the heating assembly 130, the cooling assembly 150, and the support member 170), the system 100 can be made to accept multiple substrates for simultaneous processing without changing the structure or operation.

In the exemplified embodiment, the heating assembly 130 is located within the chamber 101 to subject the substrate(s) to heat during the reflow soldering process. Of course, the invention is not to be so limited in all embodiments and it is possible that the heating assembly 130 could be positioned external to the chamber 101 in other embodiments so long as it is configured to generate sufficient heat to be applied to the substrate as needed during the reflow soldering process. The heating assembly 130 should reach a temperature that is above the melting point of the solder material being used in the reflow soldering process. This may be a temperature of 200° C. to 250° C., and more specifically between 220° C. and 240° C. during the reflow stage as described further below.

Figure 2:
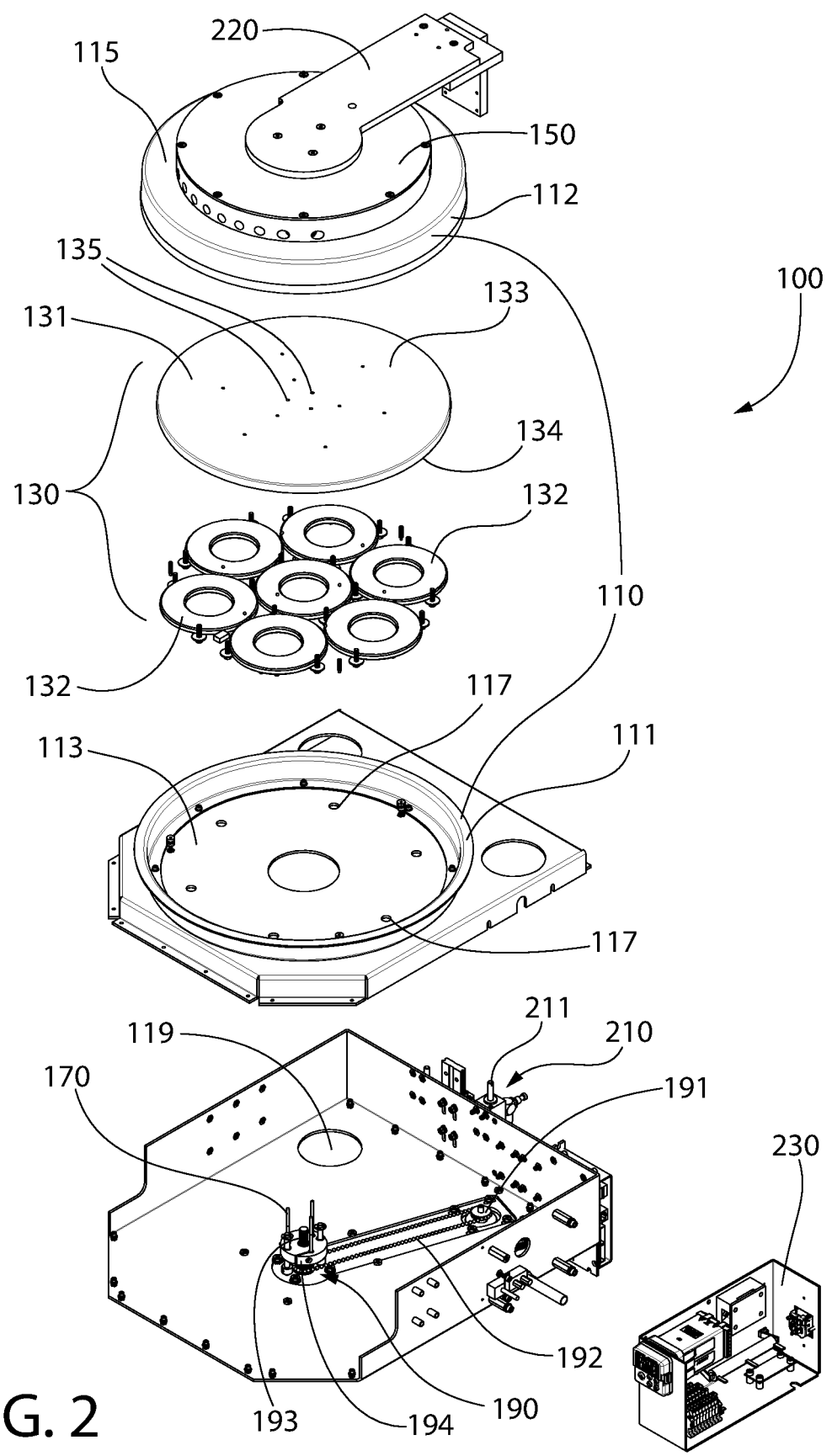
FIG. 2 is an exploded perspective view of the reflow soldering system of FIG. 1.
Figure 9:
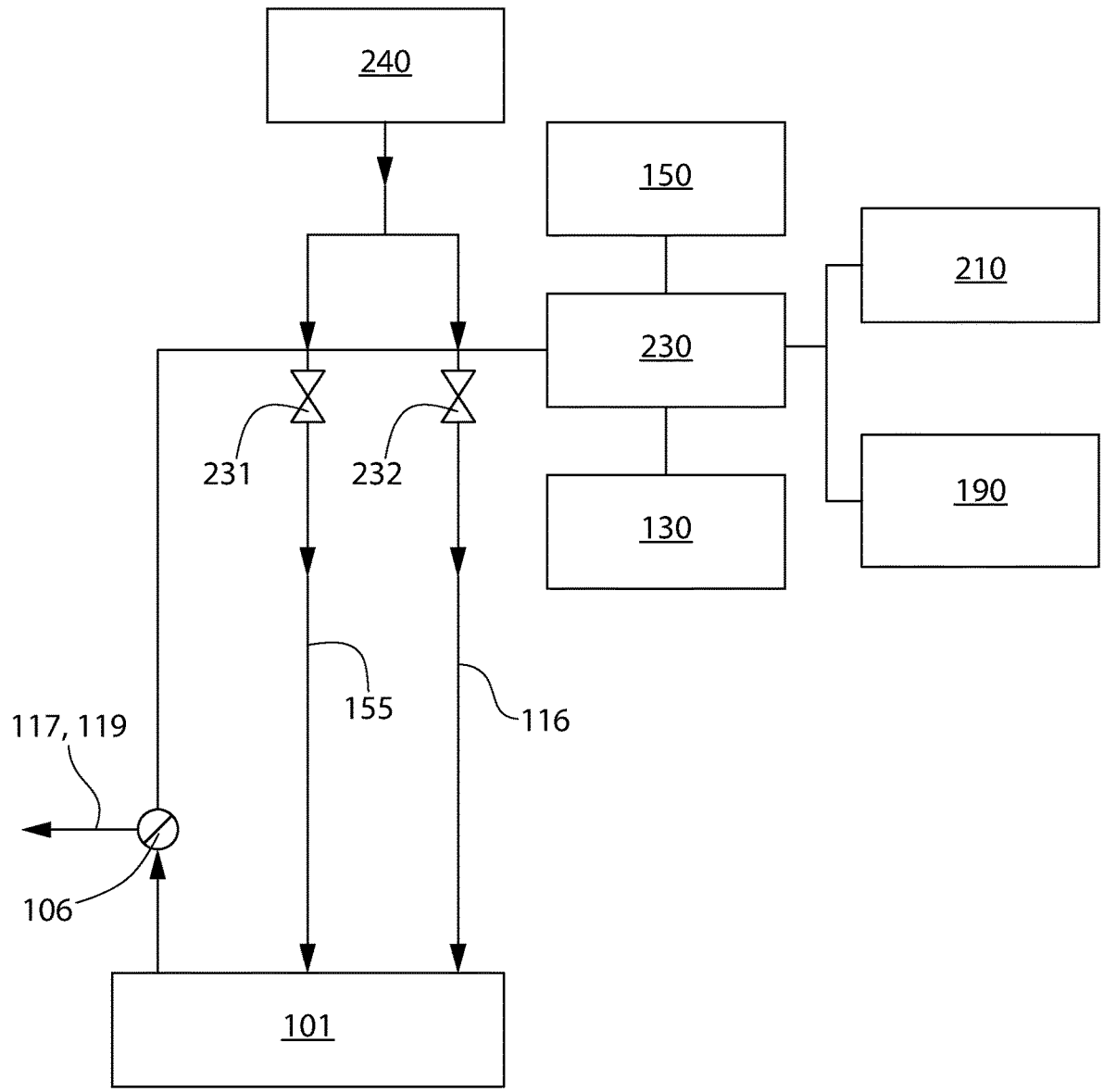
FIG. 9 is a schematic diagram of the reflow soldering system of FIG. 1.

In the exemplified embodiment, the heating assembly 130 comprises a plate member 131 and one or more heating elements 132 operably coupled to the plate member 131. In the exemplified embodiment, as shown in FIG. 2, the heating assembly 130 comprises seven donut-shaped heating elements 132 positioned in a circular arrangement adjacent, and preferably in contact with, a rear surface 134 of the plate member 131. Of course, fewer or greater than seven of the heating elements 132 could be used in other embodiments and the heating elements 132 can have any desired shape and are not limited to being donut-shaped. However, in some embodiments the heating elements 132 are coupled to the plate member 131 in a manner that ensures that the plate member 131 is consistently heated and maintained at a constant temperature during each stage or zone of the process, as described more fully below. The heating elements 132 may be electrical heating elements, metal heating elements, ceramic heating elements, gas heating elements, fluid-flow style heating elements, or the like as may be desired. Thus, the invention is not to be particularly limited by the type or style of heating element used so long as the heating elements 132 are configured to adequately heat the plate member 131 to an acceptable temperature for reflow soldering as described herein. The heating assembly 130, and more specifically the heating elements 132 thereof, are operably coupled to the control unit 230, as best shown in FIG. 9. Thus, the control unit 230 can control activation and deactivation of the heating elements 132 so that they are activated to generate heat only when needed during the reflow soldering process. The control unit 230 may have stored algorithms to determine when to activate and deactivate the heating elements 132 during operation.

Figure 3:
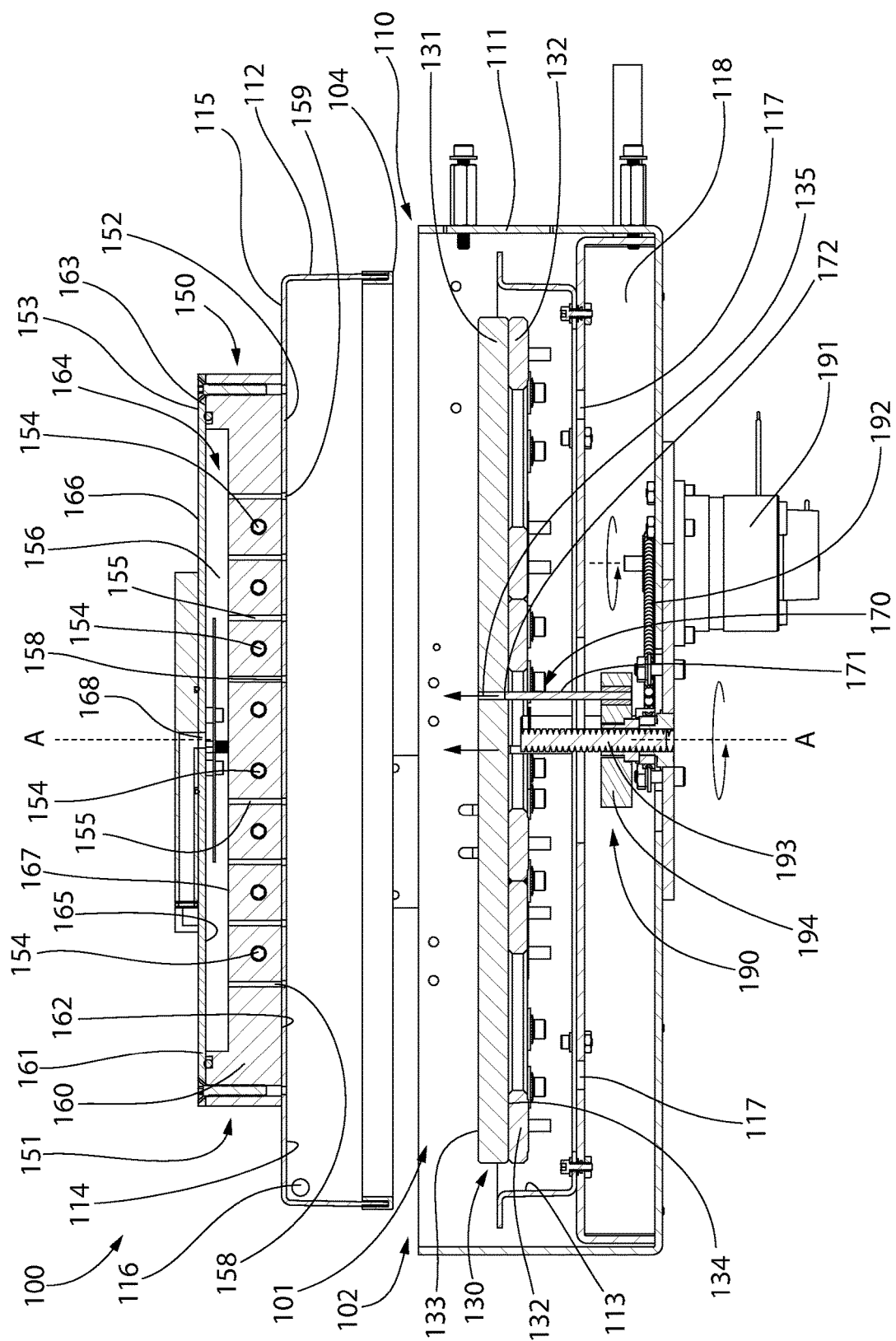
FIG. 3 is a schematic cross-sectional view taken along line III-III of FIG. 1B illustrating a first actuator unit of the system being actuated in a first direction.

The plate member 131 may be formed of a heat conductive material. Such heat conductive materials may include metals such as copper, aluminum, brass, steel, or the like. However, the invention is not to be so limited and the plate member 131 may be formed of non-metal heat conductive materials in other embodiments if so desired (e.g., diamond, graphite, etc.). Furthermore, as best seen in FIGS. 2 and 3, the plate member 131 of the heating assembly 130 comprises a front surface 133 and a rear surface 134 opposite the front surface 133. Furthermore, the plate member 131 comprises one or more openings 135 extending through the plate member 131 from the front surface 133 to the rear surface 134. The openings 135 are configured to receive portions of the support member 170 during operation of the reflow soldering system 100 as will be described in more detail below.

The cooling assembly 150 is configured to cool the substrate when required during the reflow soldering process. As noted above, in the exemplified embodiment the cooling assembly 150 is coupled to the outer surface 115 of the second member 112 of the housing 110. Thus, the cooling assembly 150 is not located within the chamber 101 when the housing 110 is in the closed state, but rather the cooling assembly 150 is located external to the chamber 101. However, the invention is not to be so limited in all embodiments and it is possible for the cooling assembly 150 to be located within the chamber 101 in alternative embodiments. Regardless of whether the cooling assembly 150 is located within or outside of the chamber 101, the cooling assembly 150 should be spaced apart from the heating assembly 130. The heating and cooling assemblies 130, 150 are spaced apart from one another both when the housing is in the closed state and in the open state. This will be described in greater detail below with reference to the cross-sectional schematic views of the reflow soldering system 100.

The chamber 101 extends from a bottom end to a top end along a longitudinal axis A-A. The heating assembly 130 and the cooling assembly 150 are positioned so that the longitudinal axis A-A of the chamber 101 intersects both the heating assembly 130 and the cooling assembly 150. The heating and cooling assemblies 130, 150 are axially spaced apart from one another.

The cooling assembly 150 comprises a plate assembly 151 that is affixed to the outer surface 115, and more specifically a top surface, of the second member 112 of the housing 110. The plate assembly 151 may be separately formed from the second member 112 of the housing 110 and coupled thereto using hardware (screws, nails, bolts, etc.), adhesive, friction-fit, or the like. Alternatively, it is possible that in an alternative embodiment the plate assembly 151 may be integrally formed with the second member 112 of the housing 110. Thus, in some embodiments the cooling assembly 150 may be formed as a part of the second member 112 of the housing 110.

The plate assembly 151 comprises a first surface 152 and a second surface 153 opposite the first surface 152. The first surface 152 of the plate assembly 151 is located adjacent to the outer surface 115 of the second member 112 of the housing 110 and the second surface 153 of the plate assembly 151 faces away from the housing 110. The plate assembly 151 comprises various channels and passageways that permit the flow of various fluids therethrough, as discussed in more detail below.

In the exemplified embodiment, the plate assembly 151 comprises a plate member 160 and a cover 161. The plate member 160 comprises a first surface 162 that forms the first surface 152 of the plate assembly 151 and a second surface 163 opposite the first surface 162. Furthermore, a recess 164 is formed into the second surface 163 of the plate member 160. The recess 164 has a floor 167. The cover 161 has a first surface 165 and a second surface 166 that forms the second surface 153 of the plate assembly 151. The cover 161 is coupled to the plate member 160 so as to enclose the recess 164, thereby forming a plenum 156 of the plate assembly 151 between the floor 167 of the recess 164 and the cover 161.

The plate assembly 151 comprises one or more cooling channels 154 extending therethrough for cooling the plate assembly 151 so that it can function as the cooling assembly 150. In the exemplified embodiment, there are a plurality of the cooling channels 154 in the plate assembly 151, and more specifically the cooling channels 154 are formed into the plate member 160 of the plate assembly 151. The cooling channels 154 may be fluidly coupled together or they may form separate and distinct channels in the plate assembly 151. In the exemplified embodiment, the cooling channels 154 extend in a direction perpendicular to the longitudinal axis A-A of the chamber 101. However, the invention is not to be so limited in all embodiments and the cooling channels 154 can extend in any desired manner to cool or chill toe plate assembly 151.

The cooling channels 154 are located within the body of the plate assembly 151 between the first and second surfaces 152, 153 of the plate assembly 151, and more specifically between the floor 167 of the recess 164 and the first surface 152 of the plate assembly 151. The cooling channels 154 are configured to receive a coolant such that the coolant can flow through the cooling channels 154 to remove heat from the plate assembly 151. Thus, if a heated substrate is located adjacent to the cooling assembly 150, it will be cooled by the cooling assembly 150. Thus, the coolant flowing through the cooling channels 154 serves the function of cooling the plate assembly 151. The plate assembly 151 may be formed of a heat conductive material, such as any of the materials described above with regard to the plate member 131.

Placing the substrate adjacent to the cooling assembly 150 may be insufficient, by itself, to adequately cool the substrate during operation. Thus, the cooling assembly 150 may also include passageways that facilitate introduction of a fluid (preferably a gas) through the cooling assembly 150 and into the chamber 101 during operation so that the fluid being introduced contacts the substrate to cool it. Specifically, because the fluid is flowing through passageways formed into the cooling assembly 150 (which is being cooled/chilled due to the coolant flowing through the cooling channels 154), the fluid is cooled and as it contacts the substrate it quickly cools the substrate. In some embodiments, the fluid that flows through the cooling assembly 150 and into the chamber may be Nitrogen, although the invention is not to be so limited in all embodiments and other fluids may be used. The specific type of fluid (i.e., gas) used may depend upon the nature of the solder and the type and quantity of flux used, if any.

In that regard, the plate member 160 comprises one or more fluid conduits 155 extending therethrough to facilitate flowing a fluid through the cooling assembly 150 and into the chamber 101. Each of the fluid conduits 155 extends from the floor 167 of the recess 164 to the first surface 162 of the plate member 160 (which is also the first surface 152 of the plate assembly 151). Thus, the fluid conduits 155 are fluidly coupled to the plenum 156 of the plate assembly 151. However, the fluid conduits 155 and the plenum 156 are fluidly isolated from the cooling channels 154. The plate assembly 151 also comprises an inlet port 168 that facilitates introduction of a fluid into the plenum 156 and from the plenum 156 through the fluid conduits 155 of the plate member 160.

Each of the fluid conduits 155 terminates in an opening 158 in the first surface 152 of the plate assembly 151. The cooling assembly 150 is positioned on the second member 112 of the housing 110 so that each of the openings 158 of the fluid conduits 155 is aligned with an opening 159 in the outer surface 115 of the second member 112 of the housing 110. This enables fluid that flows through the fluid conduits 155 to flow through the second member 112 of the housing 110 and into the chamber 101 during operation, as discussed in more detail below.

In addition to fluid flow through the fluid conduits 155, in certain embodiments fluid ports 116 may also be formed into the second member 112 of the housing 110. This provides a secondary fluid flow into the chamber 101. In the exemplified embodiment, the fluid conduits 155 are aligned with a central portion of the chamber 101 and the fluid ports 116 are aligned with a peripheral portion of the chamber 101 that surrounds the central portion of the chamber 101. Thus, if fluid flows through both the fluid conduits 155 and the fluid ports 116, the fluid will join within the chamber 101 to create a fluid or gas stream within the chamber 101. In some embodiments, the fluid conduits 155 and the fluid ports 116 may collectively be referred to as inlet ports.

Moreover, the housing 110 also comprises one or more outlet ports 117 that permit fluid to exit the chamber 101. Specifically, as the chamber 101 fills with the fluid (which is preferably a gas), the fluid in the chamber 101 will pass through the outlet ports 117, into a plenum 118, and then out through an exhaust 119. Specifically, as the fluid is being introduced into the chamber 101 through the inlet ports 116 and the fluid conduits 155, fluid will need to also flow out of the chamber 101 to ensure that the pressure inside the chamber 101 does not get too high. In some embodiments, the fluid flow through the inlet ports 116 and the fluid conduits 155 should be higher than the fluid flow through the outlet ports 117 and the exhaust 119 so that a slightly positive pressure is maintained within the chamber 101. This can be achieved with valves, mass flow controllers, altering the size/shape of the inlet ports 116 and/or fluid conduits 155 and the outlet ports 117, altering the flow rate of the fluid into the chamber 101, or the like. However, the invention is not to be so limited and in other embodiments the chamber 101 may be maintained at a negative or neutral pressure rather than a slightly positive pressure.

Referring briefly to FIG. 9, the connections of the various components to the control unit 230 and their purpose will be described. The control unit 230 is operably coupled to the first actuator unit 190 to control movement of the support member 170 as described herein below. The control unit 230 is operably coupled to the second actuator unit 210 to control opening and closing of the housing 110 as described herein above. The control unit 230 is also operably coupled to the heating and cooling assemblies 130, 150 to control their operation as described herein. Specifically, the control unit i 230 may dictate when to flow coolant through the cooling assembly 130 for cooling/chilling thereof and when to activate the heating elements 132 of the heating assembly 130.

Furthermore, the control unit 230 is operably coupled to a first flow control element 231 to control fluid flow through the fluid conduits 155 and to a second flow control element 232 to control fluid flow through the inlet ports 116. Each of the first and second flow control elements 231, 232 may be a valve, a mass flow controller, or the like. Each of the first and second flow control units 231, 232 are located along a conduit or channel that is coupled to a fluid source 240. The first and second fluid control units 231, 232 may be coupled to the same fluid source or to a different fluid source.

The first flow control element 231 is located upstream of the fluid conduits 155 (and more preferably upstream of the plenum 157) to permit or prevent flow of the fluid from the fluid source 240 to the fluid conduits 155. The first flow control element 231 may be positioned at any location that enables it to control the flow of the fluid into and through the fluid conduits 155, such as being located along the fluid conduits 155, along the plenum 157, or between the plenum 157 and the fluid conduits 155. The second flow control element 232 is located upstream of the fluid ports 116 to permit or prevent fluid of the fluid from the fluid source 240 to the fluid ports 116. The second flow control element 232 may be positioned at any location that enables it to control the flow of the fluid into and through the fluid ports 116, such as being located along or within the fluid ports 116 or upstream of the fluid ports 116.

The control unit 230 may be configured to control the opening and closing of the first and second flow control elements 231, 232 to control the rate of flow of fluids (or to control whether or not the fluid can flow through the first and second flow control elements 231, 232 at all). When the first flow control element 231 is open, fluid can flow from the fluid source 240 through the first fluid control element 231 to the fluid conduits 155 and from there into the chamber 101. When the second flow control element 232 is open, fluid can flow from the fluid source 240 through the second fluid control element 232 to the fluid ports 116 and from there into the chamber 101. When the first and second flow control elements 231, 232 are closed, fluid is prevented from flowing downstream of the first and second fluid control elements 231, 232, and thus flow of fluid through the fluid conduits 155 and the fluid ports 116 is prevented.

As shown in FIG. 9, the system 100 may also include an exhaust damper 105 positioned at or upstream of the fluid outlet 117 (and/or upstream of the exhaust 119). When the exhaust damper 105 is closed, fluid can not flow through the fluid outlet 117 (and/or the exhaust 119). When the exhaust damper 105 is open, fluid can flow through the fluid outlet 117 (and the exhaust 119). Thus, the control unit 230 may be operably coupled to the exhaust damper 105 to control the opening and closing of the exhaust damper 105, thereby controlling the flow of the fluid out of the chamber 101 to the atmosphere via the fluid outlet 117 and/or the exhaust 119.

Referring to FIGS. 2 and 3 concurrently, the first actuator unit 190 and the support member 170 will be described. As mentioned above, the first actuator unit 190 is operably coupled to the control unit 230 (FIG. 9) so that the control unit can cause relative movement between a substrate supported by the support member 170 and the heating and cooling assemblies 130, 150 using the first actuator unit 190. In the exemplified embodiment, this is achieved by the first actuator unit 190 moving the support member 170, which supports one or more substrates, while the heating and cooling assemblies 130, 150 remain static. Thus, the heating and cooling assemblies 130, 150 are in a fixed position (i.e., non-movable, static) while the support member 170 and the substrate supported thereby is moved axially within the chamber 101 (upwardly and downwardly in opposing directions parallel to the longitudinal axis A-A) by the first actuator unit 190.

Of course, the invention is not to be so limited in all embodiments. In other embodiments the substrate may be held in a fixed position within the chamber 101 and the heating and cooling assemblies 130, 150 may move, in tandem, relative to the substrate. For example, the first actuator unit 190 may be configured to move the entire housing 110 upwardly and downwardly in a direction parallel to the longitudinal axis A-A while the substrate remains in a fixed position. Alternatively, the first actuator unit 190 may be configured to move the heating assembly 130 and the cooling assembly 150 in tandem in opposite direction parallel to the longitudinal axis A-A while the housing 110 and the substrate remain in a fixed position (i.e., are not moving).

In still other embodiments the heating and cooling assemblies 130, 150 may be separately movable relative to the substrate while the substrate is static. Any of these options may deliver the same results. Thus, in certain embodiments the invention merely requires that the first actuator unit 190 cause relative movement between the substrate supported in the chamber 101 and the heating and cooling assemblies 130, 150 regardless of the exact manner in which that relative movement is achieved.

In the exemplified embodiment, the first actuator unit 190 comprises a motor 191, a belt and pulley system 192, a screw member 193, and an elevator member 194. The motor 191 is operably coupled to the control unit 230 to power and activate the first actuator unit 190 as desired/necessary for operation of the system 100. During operation, the motor 191 rotates, which in turn rotates the belt around the pulleys of the belt and pulley system 192, which in turn rotates the screw member 193. As the screw member 193 rotates, the elevator member 194 moves upwardly or downwardly along the screw member 193, depending on the direction of rotation of the screw member. Specifically, rotation of the screw member 193 in a first direction (for example, a counter-clockwise direction) causes the elevator member 194 to move axially upwardly along the screw member 193 and rotation of the screw member 193 in a second direction (for example, a clockwise direction) causes the elevator member 194 to move axially downward along the screw member 193. In the exemplified embodiment, the screw member 193 and the elevator member 194 are located between the heating assembly 130 and the bottom end of the chamber 101.

In the exemplified embodiment the support member 170 comprises one or more support elements 171 that are coupled to the elevator member 194. Thus, the support member 170 moves in tandem with the elevator member 194, meaning as the elevator member 194 moves upwardly within the chamber 101, so too does the support member 170 and as the elevator member 194 moves downwardly within the chamber 101, so too does the support member 170. In the exemplified embodiment, each of the support elements 171 is an elongated pin-like element that extends axially upward from the elevator member 194 and terminates in a distal end 172 that forms a support portion of the support member 170. In the exemplified embodiment, the support member 170 comprises three of the support elements 171 arranged in a circumferentially spaced apart manner in approximately 120° intervals. However, the invention is not to be so limited and the support member 170 may comprise a single one of the support elements 171 in other embodiments or multiple (two, three, or more than three) of the support elements 171 with any circumferential spacing.

Of course, the arrangement of the first actuator unit 190 and the support member 170 is not limited to that which is shown in the exemplified embodiment. In other embodiments, the support member 170 may comprise a clamp, a chuck (with or without vacuum), or any other device capable of holding a substrate and moving it within the chamber 101. Although in the exemplified embodiment the first actuator unit 190 comprises a screw and elevator mechanism, the invention is not to be so limited and the first actuator unit 190 may alternatively comprise a pneumatic, hydraulic, or otherwise controllable actuator to pneumatically, hydraulically, or otherwise controllably raise and lower the support member 170. Furthermore, as noted above in other embodiments the first actuator unit 190 may raise and lower the heating and cooling assemblies 130, 150 rather than raising and lowering the support member 170. In such embodiments, the heating and cooling assemblies 130, 150 would be coupled to the first actuator unit 190 and the support member 170 would be non-movably positioned within the chamber 101.

As noted above, the control unit 230 is operably coupled to the heating assembly 130 (or the heating elements 132 thereof), the cooling assembly 150, the first actuator unit 190, the second actuator unit 210, the first and second flow control elements 231, 232, and the exhaust damper 106 to control operation of the system 100. The control unit 230 may in some embodiments comprise a processor and a memory device. The processor and memory device may be separate components, or the memory device may be integrated with the processor within the control unit 230. Furthermore, the control unit 230 may include only one processor and one memory device, or it may include multiple processors and multiple memory devices. The processor of the control unit 230 may be any computer or central processing unit (CPU), microprocessor, micro-controller, computational device, or circuit configured for executing some or all of the processes described herein, including without limitation: (1) activation and deactivation of the first and second actuator units 190, 210; (2) activation and deactivation of the heating elements 132 of the heating assembly 130; (3) activation of flow of coolant through the cooling assembly 150; (4) opening and closing of the flow control elements 231, 232 and the exhaust damper 117 to facilitate the flow of fluid/gas into and out of the chamber 101.

The memory device of the control unit 230 may include, without limitation, any suitable volatile or non-volatile memory including random access memory (RAM) and various types thereof, read-only memory (ROM) and various types thereof, USB flash memory, and magnetic or optical data storage devices (e.g. internal/external hard disks, floppy discs, magnetic tape CD-ROM, DVD-ROM, optical disk, ZIP™ drive, Blu-ray disk, and others), which may be written to and/or read by the processor which is operably connected thereto. The memory device may store algorithms and/or calculations that can be used (by the processor) to determine when to activate/deactivate the various actuator units 190, 210, activate/deactivate the heating elements 132, activate/deactivate the cooling assembly 150, and open/close the flow control elements 231, 232 and exhaust damper 117 as described herein.

Figure 4:
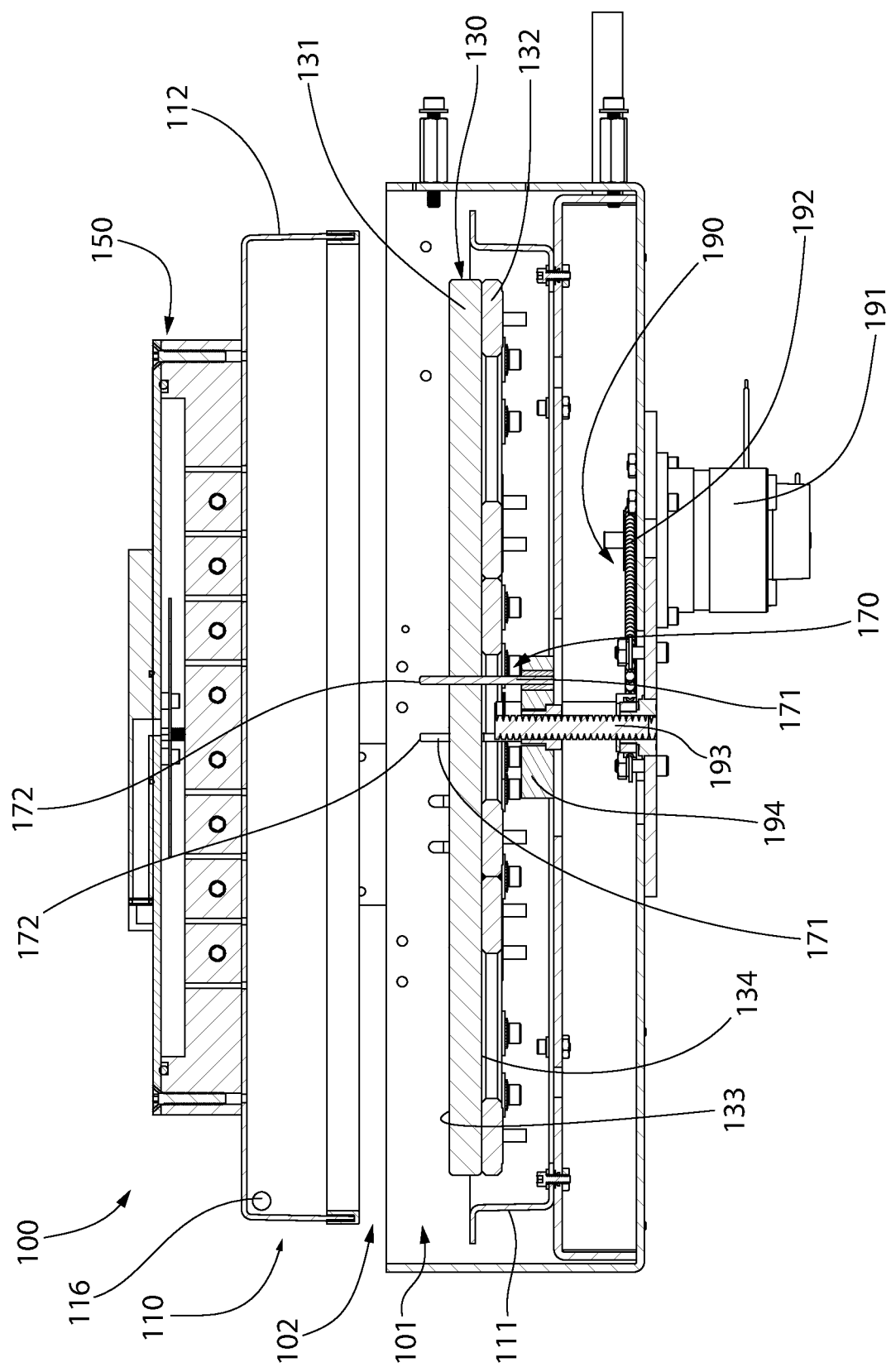
FIG. 4 is the schematic cross-sectional view of FIG. 3 with a support member having been moved upwardly due to actuation of the first actuator unit in the first direction.

Referring to FIGS. 3 and 4, the movement of the elevator member 194 in response to rotation of the screw member 193 is shown. Specifically, in the exemplified embodiment, as the screw member 193 moves in a counter-clockwise direction, the elevator member 194 moves axially upwardly within the chamber 101 in a direction parallel to the longitudinal axis A-A of the chamber 101 (of course, it could be flipped so that clockwise rotation of the screw member 193 causes upward movement of the elevator member 194). Furthermore, because the support member 170 is coupled to the elevator member 194, the support member 170 also moves axially upwardly within the chamber 101 in a direction parallel to the longitudinal axis A-A of the chamber 101.

As noted previously, the plate member 131 of the heating assembly 130 comprises one or more openings 135. As seen in FIGS. 3 and 4, each of the support elements 171 of the support member 170 extend into and through one of the openings 135 in the plate member 131 of the heating assembly 130. This is necessary in the exemplified embodiment because the support member 170 is coupled to the elevator member 194, which is located beneath the plate member 131 of the heating assembly 130. Thus, in order to move the substrate between the heating assembly 130 and the cooling assembly 150, the support elements 171 extend through the plate member 131 of the heating assembly 130 via the openings 135. Of course, with alternative arrangements for the support member 170, the requirement for holes in the plate member 131 of the heating assembly 130 may be negated. For example, the support member could be a ring-shaped member having a greater diameter than that of the plate member 131 of the heating assembly 130. In FIG. 3, the distal ends 172 of the support elements 171 of the support member 170 are located within the openings 135. In FIG. 4, the distal ends 172 of the support elements 171 of the support member 170 protrude from the front surface 133 of the plate member 131 of the heating assembly 130 so that the distal ends (i.e., support portions) 172 of the support elements 171 are located between the heating assembly 130 and the cooling assembly 150.

In FIG. 4, the housing 110 is in the open state such that the second member 112 is separated or otherwise spaced apart from the first member 111. Thus, in FIG. 4, the passageway 102 exists into the chamber 101 so that substrates can be loaded into and unloaded from the chamber 101.

Figure 5:
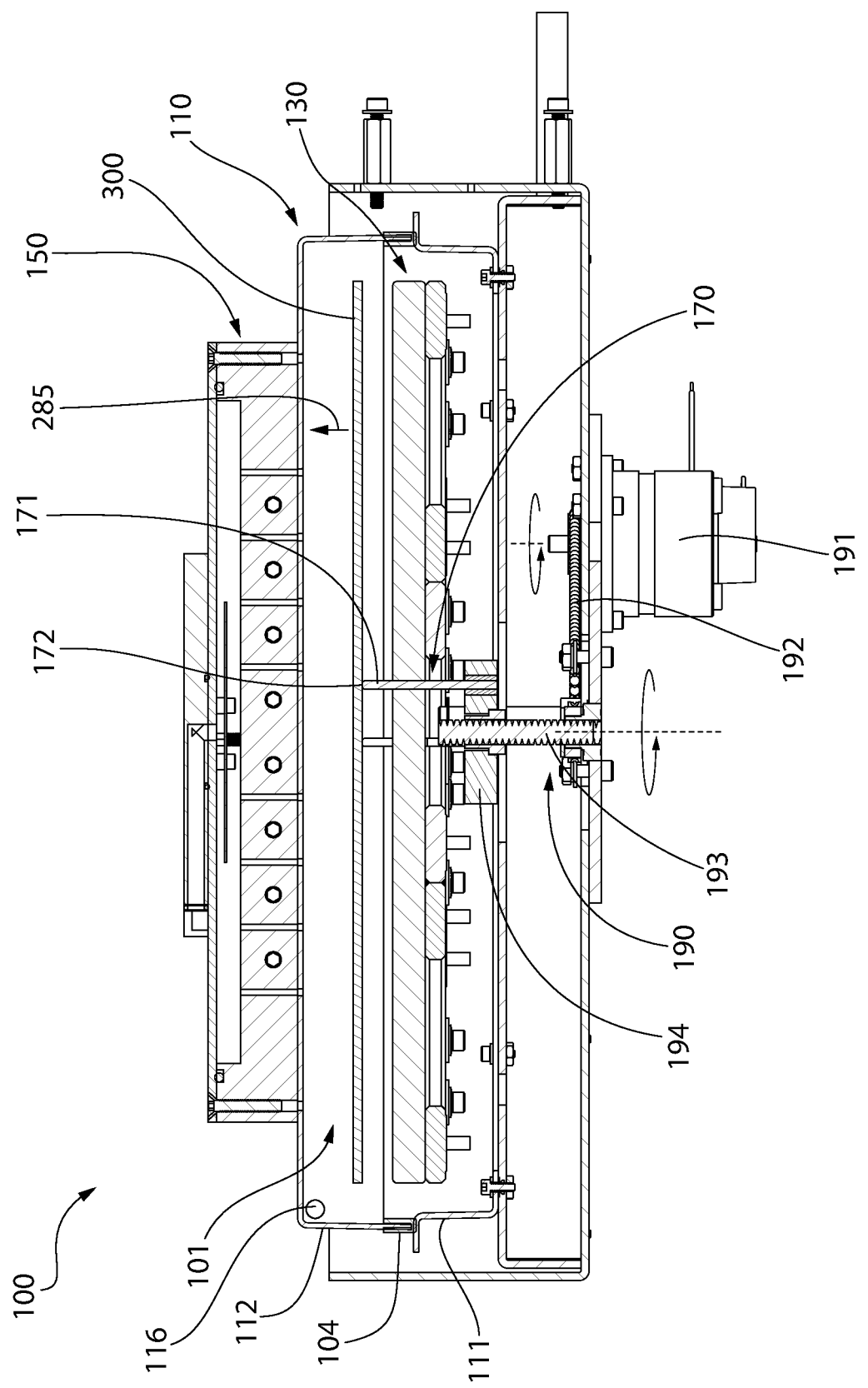
FIG. 5 is a schematic cross-sectional view taken along line V-V of FIG. 1A with a substrate being supported by the support member and the housing in the closed state thereby defining a chamber.

Referring to FIG. 5, a substrate 300 is illustrated being supported by the support member 170 within the chamber 101. Thus, the substrate 300 has been inserted into the chamber 101 via the passageway 102. The process of loading the substrate 300 into the chamber 101 is not illustrated, but it should be appreciated that it can be accomplished manually by an operator or automatically by a robot-type handling device that is operably coupled to the control unit 230. In the exemplified embodiment, the substrate 300 is supported by the distal ends 172 (i.e., the support portions) of the support elements 171 of the support member 170. Furthermore, in FIG. 5, the housing 110 has been altered into the closed state by moving the second member 112 into contact with the first member 111. As noted above, the gasket 104 on the second member 112 directly contacts the first member 111, thereby creating a tight seal between the first and second members 111, 112.

Furthermore, in FIG. 5 the first actuation unit 190 is being actuated so that the screw member 193 is rotating in the first direction. In the exemplified embodiment, rotation of the screw member 193 in the first direction causes the elevator member 194 and the support member 170 to move in a first direction 285. Specifically, in the exemplified embodiment rotation of the screw member 193 in the first direction causes the elevator member 194 and the support member 170 to move away from the heating assembly 130 and towards the cooling assembly 150. Rotation of the screw member 193 in a second direction that is opposite to the first direction (see, for example, FIG. 7B) causes the elevator member 194 and the support member 170 to move in a second direction 286 that is opposite the first direction. Specifically, the second direction 286 is a direction away from the cooling assembly 150 and towards the heating assembly 130.

Thus, in accordance with the exemplified embodiment, actuation of the first actuation unit 190 moves the support member 170 (and hence also the substrate 300 that is supported by the support member 170) in opposite directions that are parallel to the longitudinal axis A-A of the chamber 101. As noted herein, the heating and cooling assemblies 130, 150 are axially spaced apart from one another. Thus, moving the support member 170 and the substrate 300 in the first and second directions 285, 286 moves the substrate 300 either: (1) towards the heating assembly 130 and away from the cooling assembly 150; or (2) towards the cooling assembly 150 and away from the heating assembly 130, depending on the particular stage/zone of the reflow soldering process that the substrate 300 is undergoing. Movement of the support member 170 and the substrate 300 occurs with the housing 110 and chamber 101 closed. Specifically, during the entire reflow soldering process, the chamber 101 is closed except for the existence of various inlet and outlet ports for purposes of flowing gas into and out of the chamber 101. Thus, the substrate 300 and the support member 170 moves upwardly and downwardly in a direction parallel to the longitudinal axis A-A of the chamber 101 while the substrate is located within the closed chamber 101.

As has been described above, although in the exemplified embodiment the first actuator unit 190 moves the support member 170 and substrate 300 upwardly and downwardly within the chamber 101 (i.e., in the first and second directions 285, 286) while the heating and cooling assemblies 130, 150 are static, in other embodiments the first actuator unit 190 may move the heating assembly 130 and the cooling assembly 150 upwardly and downwardly within the chamber 101 while the substrate 300 is static. Thus, the first actuator unit 190 may move the heating and cooling assemblies 130, 150 in the first direction 285, which will move the heating assembly 130 closer to the substrate 300 and the cooling assembly 150 away from the substrate 300. The first actuator unit 190 may also move the heating and cooling assemblies 130, 150 in the second direction 286, which will move the cooling assembly 150 closer to the substrate 300 and the heating assembly 130 away from the substrate 300.

Furthermore, in some embodiments a separate actuator unit may be coupled to each of the heating and cooling assemblies 130, 150 rather than having them move in tandem via coupling to the same actuator unit. Thus, in such embodiments the direction and timing of the movement of the heating assembly 130 may be different than the direction and timing of the movement of the cooling assembly 150. For example, the heating assembly 130 may be configured to move towards and away from the substrate 300 in the axial direction (i.e., parallel to the longitudinal axis A-A of the chamber) whereas the cooling assembly 150 may be configured to move towards and away from the substrate 300 in a direction perpendicular to the longitudinal axis A-A of the chamber 101). Thus, variations in the type of movement and the particular component that is moving are possible and may fall within the scope of the invention claimed herein.

Figure 6:
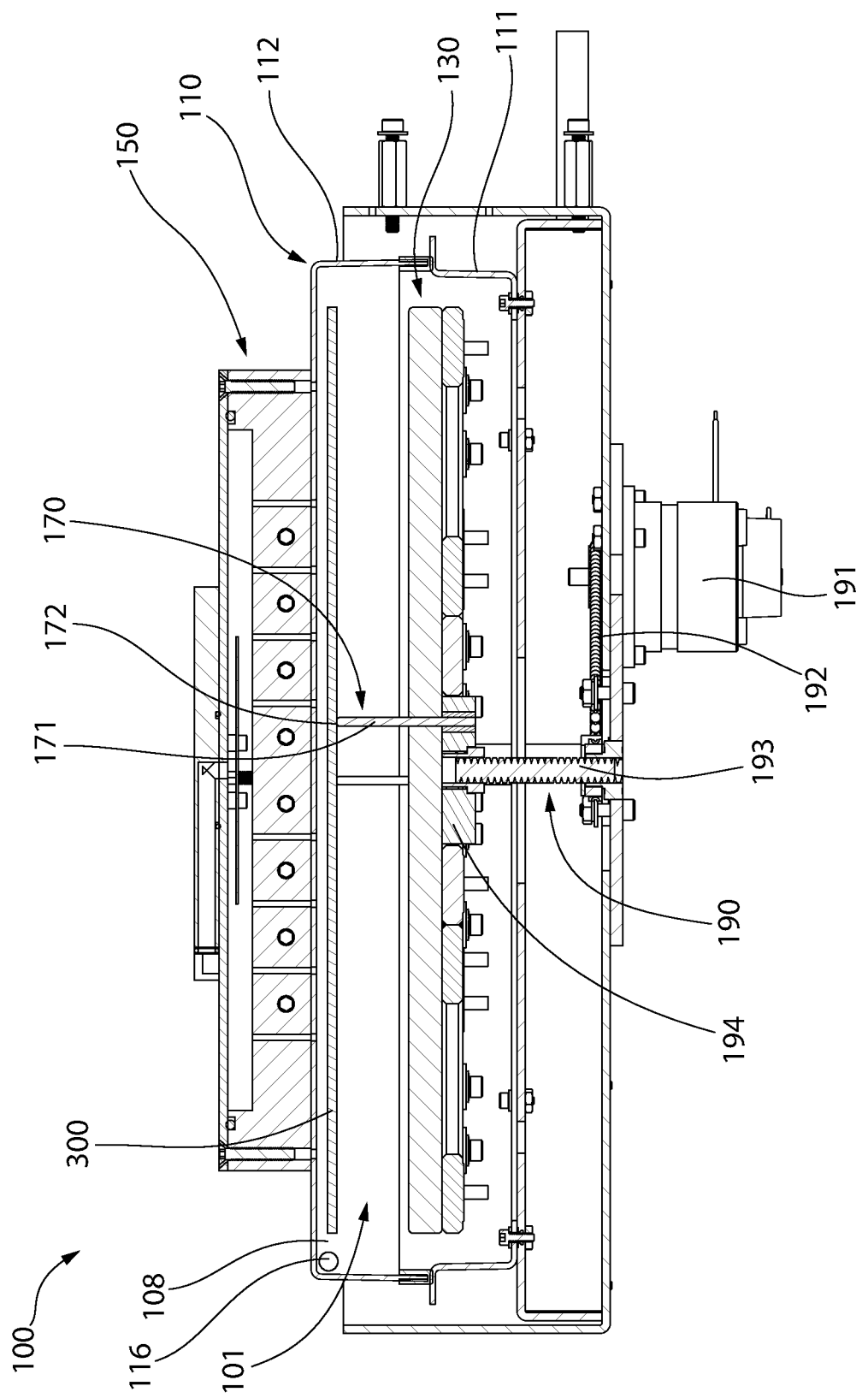
FIG. 6 is the schematic cross-sectional view of FIG. 5 with the support member having been moved to its upper-most position so that the substrate is adjacent to a cooling assembly.

FIG. 6 illustrates the results of the rotation of the screw member 193 in FIG. 5. Specifically, FIG. 6 is identical to FIG. 5 except that the support member 170 has been moved to an upper-most position whereby the distal ends 172 of the support elements 171 and the substrate 300 are located in an upper portion 108 of the chamber 101 adjacent to the cooling assembly 150. This illustrates the position in which a reflow soldering process will begin, as described below with reference to FIGS. 7A-8B.

As noted above, reflow soldering is generally a four-stage process that includes a preheat stage, a thermal soak stage, a reflow stage, and a cooling stage. During the preheat stage, the entire substrate climbs towards a target soak or dwell temperature (approximately 150° C.) over an approximately 60 second period of time. During the thermal soak stage, the temperature is increased from approximately 150° C. to approximately 165° C. over an approximately 90-120 second period of time. The thermal soak stage is intended to remove solder paste volatiles and activate the fluxes so that the flux components can begin oxide reduction on component leads and pads. During the reflow stage, the temperature is increased to a peak temperature of approximately 225-235° C. and maintained at that temperature for approximately 15-20 seconds. Finally, during the cooling stage, the temperature is decreased to approximately 30° C. to 100° C. for approximately 60-90 seconds to achieve a cooling rate of approximately 4° C./second. Of course, the temperatures and time periods noted above are merely exemplary and are not intended to be limiting of the present invention unless specified in the claims. The exact temperatures and time periods used may differ depending on the heat tolerances of the various components on the substrate (some components are more vulnerable to damage when subjected to heat than others).

Figure 7A:
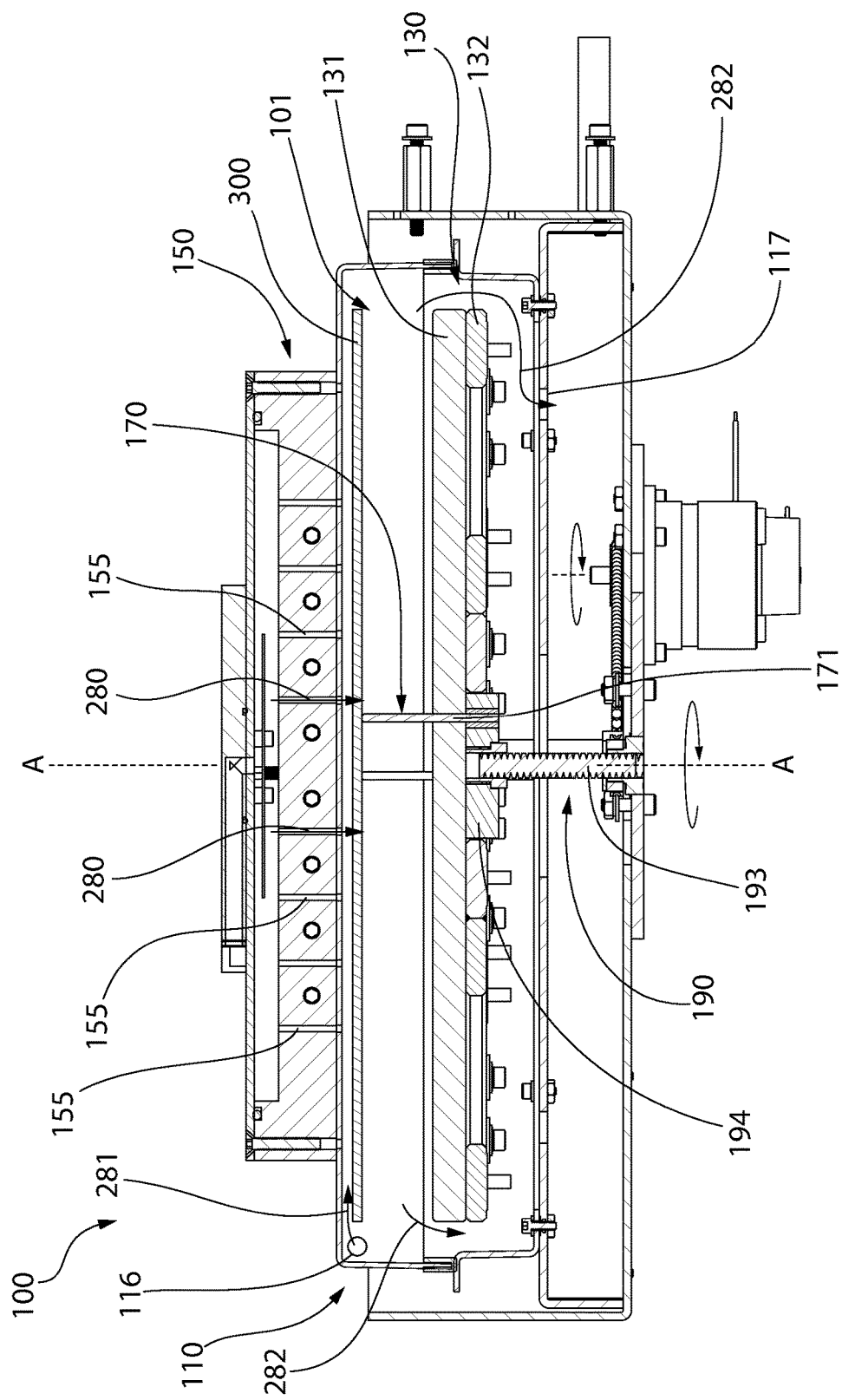
FIG. 7A is the schematic cross-sectional view of FIG. 6 illustrating a first actuator unit of the system being actuated in a second direction.

Referring to FIG. 7A, the system 100 is illustrated at the beginning of a solder reflow operation. The housing 110 is closed and the support member 170 is in its upper-most position so that the substrate 300 being supported by the support member 170 is adjacent to the cooling assembly 150 and spaced apart from the heating assembly 130. At this stage, the cooling assembly 150 does not need to be activated for cooling and thus it may be at ambient temperature. Furthermore, at this stage, a first fluid flow 280 may flow through the fluid conduits 155 and into the chamber 101 and a second fluid flow 281 may flow through the fluid ports 116 and into the chamber 101. The first and second fluid flows 280, 281 may merge into a gas stream 282 that flows through the chamber 101 to the outlet port(s) 117. The first and second fluid flows 280, 281 may create a slightly positive pressure within the chamber 101 if so desired. Furthermore, in the stage illustrated in FIG. 7A, the heating assembly 130 is activated to heat up to the desired temperature, preferably around 150° C. This continues for approximately 90-120 seconds without activating the first actuator unit 190 to allow sufficient time to purge the chamber 101 and to enable the heating assembly 130 to heat up to the desired temperature. After the heating assembly 130 reaches the desired temperature, the control unit 230 activates the first actuator unit 190 so that the screw member 193 rotates in a clockwise direction.

Figure 7B:
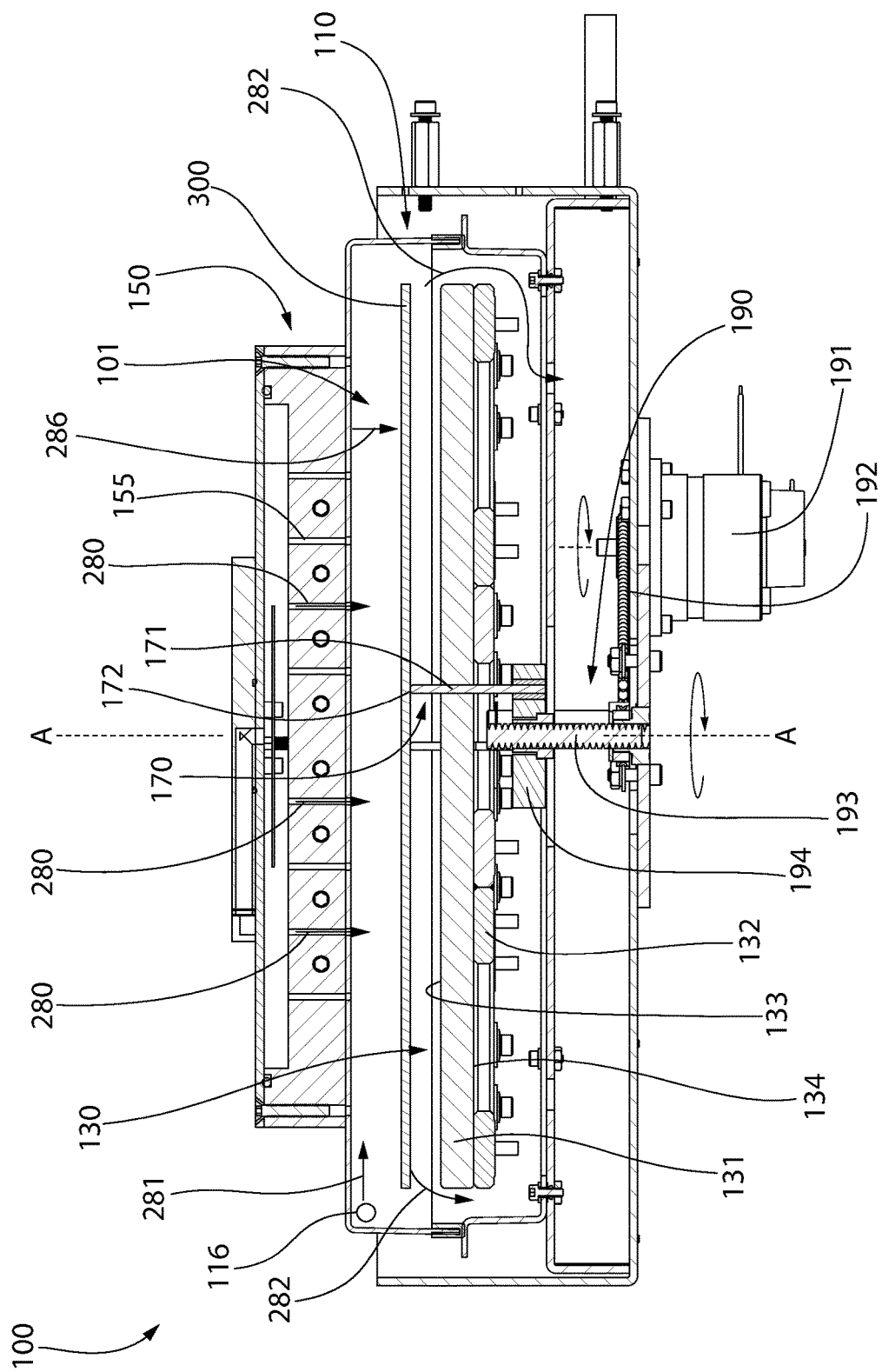
FIG. 7B is the schematic cross-sectional view of FIG. 7A illustrating the support member being moved downwardly within the chamber away from the cooling assembly and towards a heating assembly.
Figure 7C:
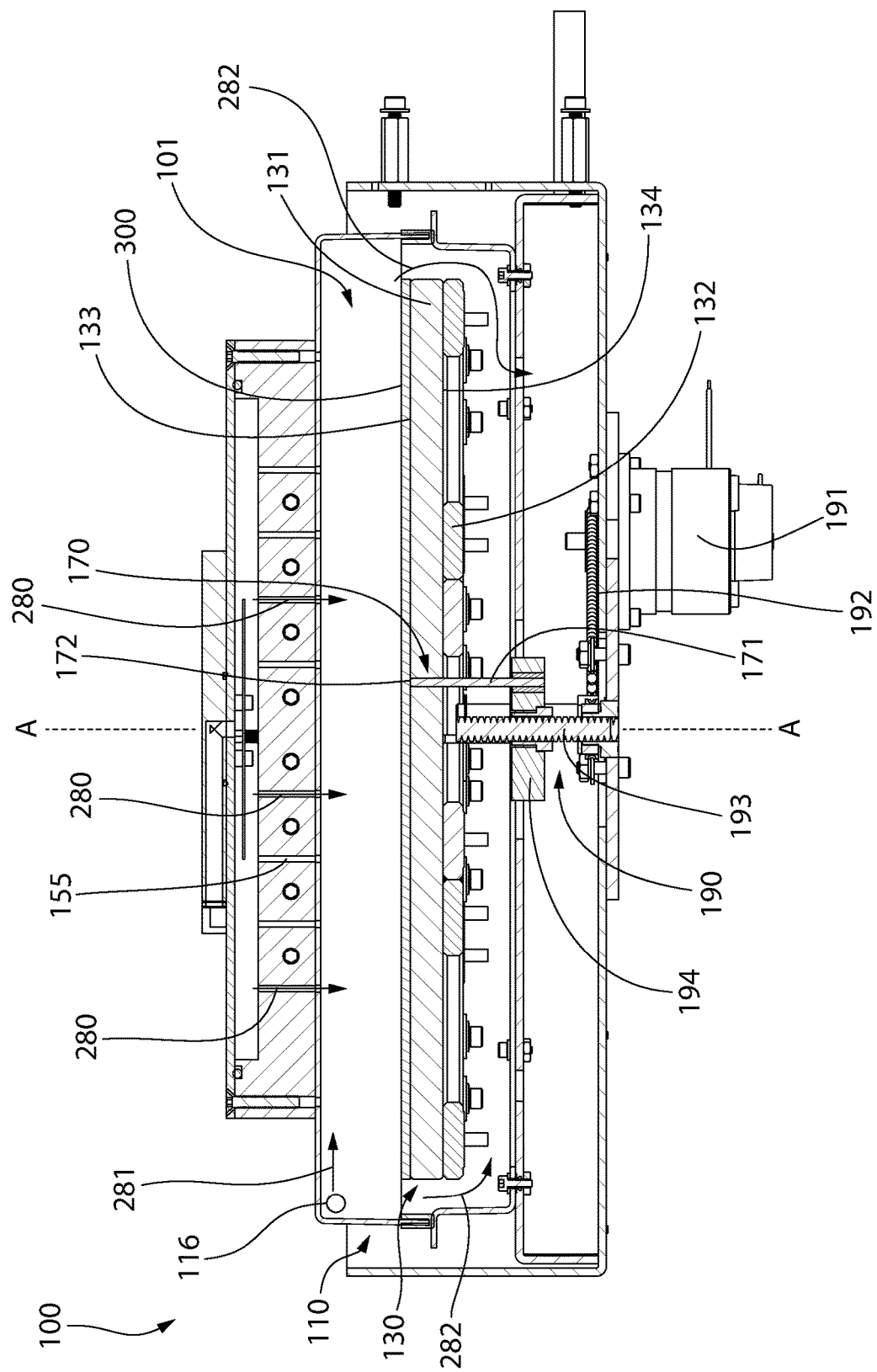
FIG. 7C is the schematic cross-sectional view of FIG. 7B illustrating the support member in its lower-most position so that the substrate rests atop of the heating assembly.

Referring to FIGS. 7B and 7C, as a result of the activation of the first actuator unit 190, the elevator member 194 and the support member 170 coupled thereto move downwardly within the chamber 101 in a direction parallel to the longitudinal axis A-A of the chamber 101 towards the heating assembly 130 and away from the cooling assembly 150. FIG. 7B illustrates the support member 170 in a central position (i.e., somewhat centrally located between the heating and cooling assemblies 130, 150) and FIG. 7C illustrates the support member 170 in a lower-most position. During this stage in the process, the first actuator unit 190 is activated until the support member 170 transitions from the upper-most position (FIG. 7A) to the lower-most position (FIG. 7B).

In the exemplified embodiment, in the lower-most position of the support member 170, the distal ends 172 of the support elements 171 are in plane with or recessed relative to the front surface 133 of the plate member 131 of the heating assembly 130 so that the substrate 300 can rest directly atop the front surface 133 of the plate member 131. Thus, as shown in FIG. 7C, when the downward axial movement of the support member 170 ends, the substrate 300 is resting directly atop the plate member 131 so that heat generated by the plate member 131 can be transferred to the substrate 300. Of course, in some embodiments the substrate 300 might not rest directly atop the plate member 131 but may be adjacent to but spaced apart from the plate member 131 of the heating assembly 130 when it is in the lower-most position. As long as the temperature of the substrate 300 increases to the desired level in the desired period of time, the exact position of the substrate 300 within the chamber 101 is not limiting of the present invention in all embodiments.

In certain embodiments, moving the support member 170 and the substrate 300 from the upper-most position shown in FIG. 7A to the lower-most position shown in FIG. 7C takes approximately 60-120 seconds. Thus, the support member 170 moves reasonably slowly to ramp up the temperature of the substrate 300. Specifically, as the support member 170 is moving axially downwardly, the substrate 300 is heating up due to it moving closer to the heating assembly 130. The slow heat-up prevents damage to the substrate 300 and the electrical components positioned thereon.

While the support member 170 and the substrate 300 are moving axially downwardly within the chamber 101, the first and second fluid flows 280, 281 as discussed above may continue (with a gas such as Nitrogen flowing into the chamber 101 via the inlet ports 116 and the fluid conduits 155). This will maintain the desired positive pressure within the chamber 101. Once the support member 170 has moved into the lower-most position illustrated in FIG. 7C, the support member 170 is maintained in that position for a predetermined period of time, for example 15-20 seconds, which is known as the reflow stage of the reflow soldering process. During the reflow stage, the first and second fluid flows 280, 281 may continue, but they may be in a low flow state such that their flow rates are reduced.

Figure 8A:
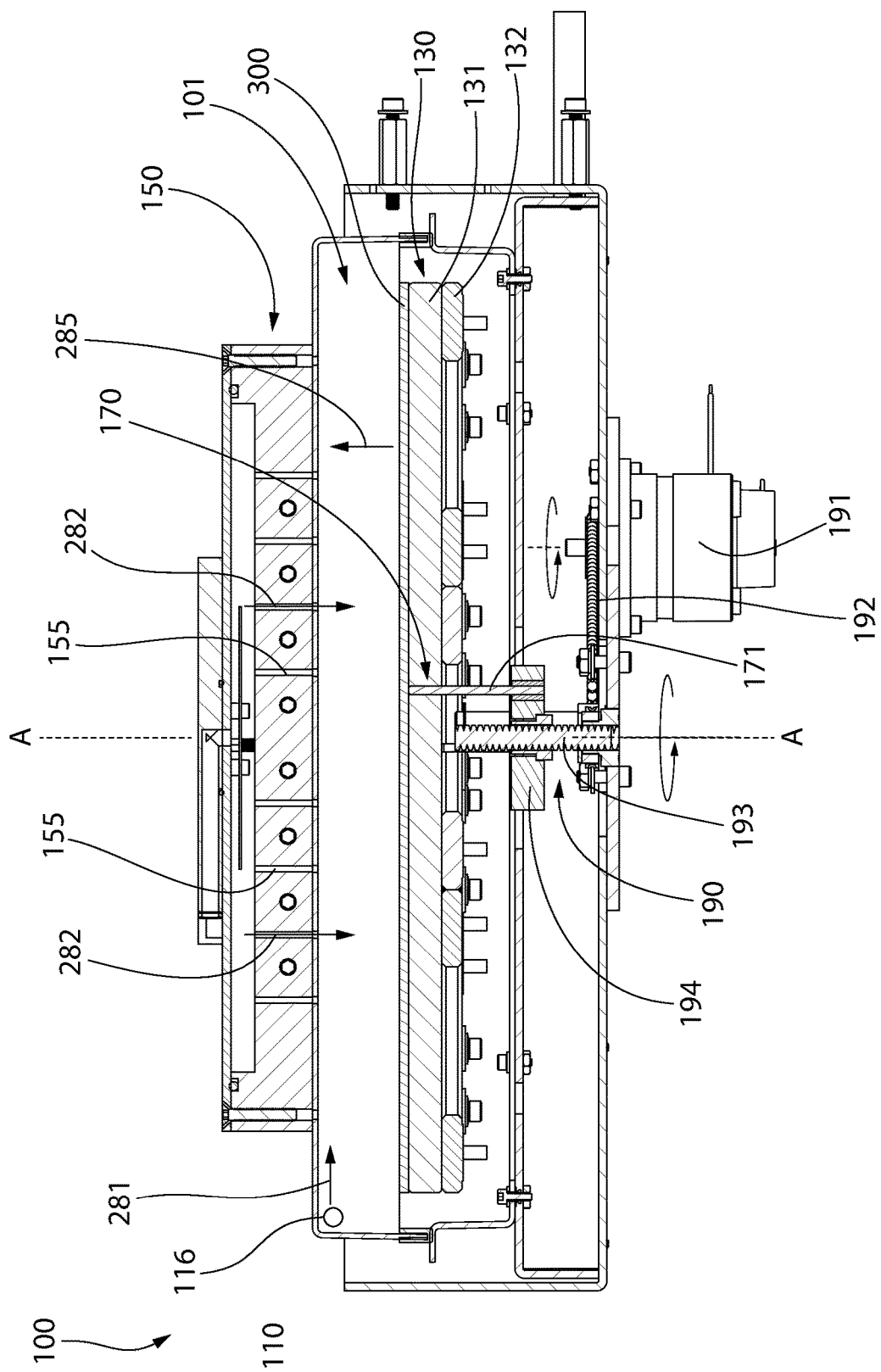
FIG. 8A is the schematic cross-sectional view of FIG. 7C illustrating the first actuator unit of the system being actuated in the first direction.

Next referring to FIG. 8A, it is time to cool the substrate 300 to complete the reflow soldering process. To start the cooling zone, the first actuator unit 190 is actuated in the opposite direction as that shown in FIG. 7A, which in FIG. 8A is illustrated as a counter-clockwise movement of the screw member 193. As a result of this actuation of the first actuator unit 190, the elevator member 194 and the support member 170 coupled thereto move upwardly within the chamber 101 in a direction parallel to the longitudinal axis A-A of the chamber 101. This upward movement of the support member 170 also moves the substrate 300 upwardly within the chamber 101 away from the heating assembly 130 and towards the cooling assembly 150.

Figure 8B:
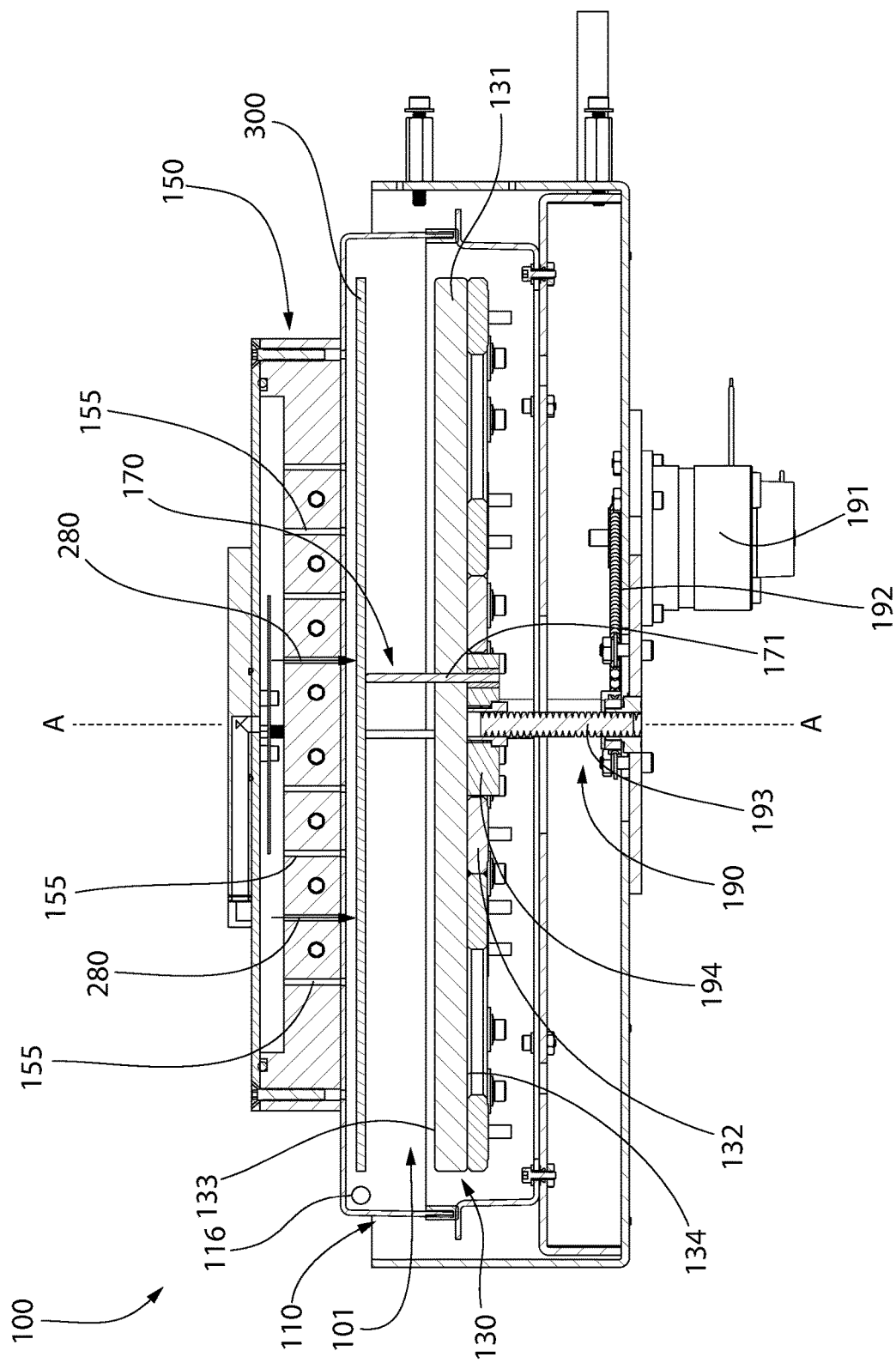
FIG. 8B is the schematic cross-sectional view of FIG. 8A illustrating the support being having been moved to its upper-most position so that the substrate is adjacent to the cooling assembly.

FIG. 8B illustrates the elevator member 194, the support member 170 and the substrate 300 back in the upper-most position with the substrate 300 adjacent to the cooling assembly 150 and spaced apart from the heating assembly 130. In this position, the elevator member 194 is located within an opening of one of the donut-shaped heating elements 132. This maximizes the vertical movement of the elevator member 194 and allows it to move until it is in contact with the rear surface 134 of the plate member 131 of the heating assembly 130. Of course, the elevator member 194 may be spaced from the rear surface 134 of the plate member 131 in the upper-most position and in such embodiments the length of the support elements 171 may be increased to ensure that the substrate 300 is still able to achieve the upper-most position as shown in FIG. 8B. The support member 170 and the substrate 300 may transition from the position shown in FIG. 8A (i.e., the lower-most position) to the position shown in FIG. 8B (i.e., the upper-most position) in approximately 2-5 seconds, although a longer period of time is also possible.

During the stages/processes illustrated in FIGS. 8A and 8B, the coolant may begin to flow through the cooling channels 154 of the cooling assembly 150 to cool the cooling assembly 150 so that it can be used to cool the substrate 300. This may be achieved by the control unit 230 sending a signal to the cooling assembly 150 to begin the cooling process, or by the control unit 230 opening/closing valves, mass flow controllers, or the like. Of course, the coolant may begin to flow through the cooling channels 154 of the cooling assembly 150 prior to the process illustrated in FIGS. 8A and 8B in other embodiments. For example, in some embodiments the cooling assembly 150 may be cooled and the heating assembly 130 heated throughout the entire process as soon as the chamber 101 is closed until the process ends and the chamber 101 is once again opened for unloading of the substrate 300. This may not affect the reflow soldering process because the substrate 300 is moved relative to the heating and cooling assemblies 130, 150 to heat and cool the substrate 300, respectively. Specifically, the substrate 300 is closer to the heating assembly 130 when heating of the substrate 300 is needed and closer to the cooling assembly 150 when cooling of the substrate 300 is needed. Thus, the heating and cooling assemblies 130, 150 may only be activated when heating and cooling of the substrate 300 is taking place, or the heating and cooling assemblies 130, 150 may be activated throughout the reflow soldering process.

Once the support member 170 and the substrate 300 reaches the upper-most position shown in FIG. 8B, the first fluid flow 280 through the fluid conduits 155 of the cooling assembly 150 continues while the second fluid flow 281 may no longer flow through the inlet port(s) 116. This is because in the stage shown in FIG. 8B, the substrate 300 is intended to be cooled. The first fluid flow 280 flows through the chilled cooling assembly 150 and thus the first fluid flow 280 is a cold fluid/gas to assist in the cooling of the substrate 300. The second fluid flow 281 is not similarly chilled because it flows through the inlet port 116 that is formed into the second member 112 of the housing 110 and does not flow through the cooling assembly 150. Thus, to effectuate the desired rate of cooling the substrate, it may be preferable to only continue the first fluid flow 280 during the cooling stage. The first fluid flow 280 may flow at an increased rate (i.e., high flow) during the cooling stage relative to the other stages.

The support member 170 and the substrate 300 are maintained in the upper-most position shown in FIG. 8B for a sufficient period of time to cool the substrate to a desired temperature. Once this has been completed, the housing 110 may be opened and the substrate 300 may be removed from the housing 110 (manually by an operator or automatically by a robot or other handling device that may or may not form a part of the system 100). During the entirety of the reflow soldering process, the substrate 300 is positioned within the axial space between the heating assembly 130 and the cooling assembly 150. Thus, during all stages of the process, the substrate 300, the heating assembly 130, and the cooling assembly 150 are intersected by, and aligned with, the longitudinal axis A-A of the chamber 101.

The table below supplements the description above and provides examples of the timing of an embodiment of the process:

| Step | Time seconds | Description | Substrate/Support Member 170 Position/Location | Fluid Flow 280 | Fluid Flow 281 | Substrate path |
|---|---|---|---|---|---|---|
| 1 | N/A | Load substrate 300 onto support member 170. Housing 110 is in open state for loading. | Between heating assembly 130 and cooling assembly 150 (FIG. 5) | OFF | OFF | Not moving |
| 2 | 2-5 | Transition support member 170 and substrate 300 to uppermost position, transition housing 110 into closed state where it remains until process end. | FIGS. 5 and 6 | ON | ON | Upward 285 |
| 3 | 90-120 | Purge | FIG. 7A | ON | ON | Not moving |
| 4 | 60-120 | Temperature ramp up | FIG. 7B | ON | ON | Downward 286 |
| 5 | 15-20 | Reflow solder melt (temperature spike) | FIG. 7C | ON/LOW FLOW | ON/LOW FLOW | Not moving |
| 6 | 2-5 | Transition substrate 300 upward away from heating assembly 130 and towards cooling assembly 150. | FIG. 8A | ON | ON | Upward 285 |
| 7 | 60-90 | Cooling substrate 300. | FIG. 8B | ON/HIGH FLOW | OFF | Not Moving |
| 8 | 2-5 | Transition housing 110 to open state. Unload substrate 300 from chamber 101. | Between heating assembly 130 and cooling assembly 150 | OFF | OFF | Not Moving |

All of the process steps, starting from that which is shown in FIG. 5 until FIG. 8B, occur with the chamber 101 closed. The only openings into the chamber 101 are those provided for introduction of gas into the chamber 101 to limit oxidation of the metals involved in the soldering process and to achieve the desired cooling of the substrate during the cooling stage.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

For example, in one embodiment rather than the second member 112 of the housing 110 going up and down to enclose the chamber 101, a hinged door could be employed. In one embodiment, rather than introducing gas into the chamber 101 downwardly and peripherally, gas could be introduced by a multiplicity of holes formed in the second member 112 of the housing 110 (i.e., the lid of the chamber 101). The entire process could be carried out at a negative or even neutral pressure rather than a slightly positive pressure. A gas other than Nitrogen could be employed depending upon the nature of the solder and the type and quantity of flux used. Rather than the support member 170 comprising three pin-like elements used to support the substrate 300, there could be only a central chuck like support or a further multiplicity of pin-like elements which rather than being raised and lowered by a screw mechanism are pneumatically, hydraulically or controllably raised and lowered by any other means. Moreover, as discussed herein the substrate 300 could be fixed in altitude and the heating and cooling assemblies 130, 150 could be moved upwardly and downwardly. Other modifications and variations would be appreciated by persons skilled in the art.

What is claimed is:

1. A reflow soldering system comprising:
    a housing defining a chamber having a longitudinal axis;
    a support member supporting a substrate within the chamber, the substrate comprising a first surface and a second surface opposite the first surface;
    a heating assembly located within the chamber on a first side of the substrate so that the heating assembly faces the first surface of the substrate, the heating assembly configured to heat the substrate during a reflow soldering process;

a cooling assembly spaced apart from the heating assembly and located on a second side of the substrate so that the cooling assembly faces the second surface of the substrate, the cooling assembly configured to cool the substrate during the reflow soldering process without any contact between the cooling assembly and the substrate;

a first actuator unit operably coupled to: (1) the heating assembly and the cooling assembly; or (2) the support member; and a control unit operably coupled to the first actuator unit to cause relative movement between the substrate and the heating and cooling assemblies in a direction parallel to the longitudinal axis using the first actuator unit;

wherein the heating and cooling assemblies are aligned with one another and intersected by the longitudinal axis.

2. The reflow soldering system according to claim 1 wherein the chamber extends from a bottom end to a top end along the longitudinal axis that intersects both of the heating and cooling assemblies which are axially spaced apart from one another.

3. The reflow soldering system according to claim 1 further comprising:

wherein the first actuator unit is operably coupled to the support member such that the first actuator unit is configured to move the support member and the substrate in a first direction and a second direction that is opposite to the first direction while the heating and cooling assemblies are static; or wherein the first actuator unit is operably coupled to the heating and cooling assemblies such that the first actuator unit is configured to collectively move the heating and cooling assemblies in the first and second directions while the support member and the substrate are static.

4. The reflow soldering system according to claim 3 further comprising:

wherein the first actuator unit is operably coupled to the support member such that: (1) movement of the support member in the first direction moves the substrate towards the cooling assembly and away from the heating assembly; and (2) movement of the support member in the second direction moves the substrate towards the heating assembly and away from the cooling assembly; or wherein the first actuator unit is operably coupled to the heating and cooling assemblies such that: (1) movement of the heating and cooling assemblies in the first direction moves the heating assembly towards the substrate and moves the cooling assembly away from the substrate; and (2) movement of the heating and cooling assemblies in the second direction moves the cooling assembly towards the substrate and moves the heating assembly away from the substrate.

5. The reflow soldering system according to claim 1 wherein the first actuator unit is operably coupled to the support member to move the substrate upwardly and downwardly within the chamber and wherein the heating and cooling assemblies are non-movable.

6. The reflow soldering system according to claim 1 wherein the housing is alterable between: (1) an open state in which a passageway into the chamber is formed for loading and unloading substrates from the chamber; and (2) a closed state in which the passageway is closed; and wherein the housing comprises a first member and a second member that are movable relative to one another to alter the housing between the open and closed states, the second member of the housing having an inner surface that faces the chamber and an opposite outer surface, and wherein the cooling assembly is coupled to the outer surface of the second member of the housing and located external to the chamber, and wherein the cooling assembly is configured to flow a chilled gas into the chamber through an opening in the second member of the housing to cool the substrate.

7. The reflow soldering system according to claim 1 wherein the cooling assembly comprises a plate member having a first surface that is in direct contact with an outer surface of the housing and a second surface opposite the first surface, the plate member having one or more cooling channels and one or more fluid conduits, each of the fluid conduits extending from the second surface of the plate member to the first surface of the plate member, and each of the fluid conduits being aligned with an opening in the outer surface of the housing, wherein a coolant flows through the one or more cooling channels to remove heat from the plate member, and wherein a gas flows through the one or more fluid conduits and into the chamber through the openings in the outer surface of the housing to alter a pressure in the chamber and/or assist in a cooling operation.

8. The reflow soldering system according to claim 1 wherein the heating assembly comprises a plate member and one or more heating elements operably coupled to the plate member to heat the plate member.

9. The reflow soldering system according to claim 1 wherein the first actuator unit comprises a screw member and an elevator member operably coupled to the screw member, the elevator member configured to move upwardly and downwardly along the screw member during rotation of the screw member, and wherein the support member comprises one or more support elements that are coupled to the elevator member and move in tandem with the elevator member.

10. The reflow soldering system according to claim 9 wherein the screw member and the elevator member are located between a bottom surface of the heating assembly and a bottom end of the chamber, and wherein the one or more support elements extend through one or more openings in the heating assembly to enable the support elements to protrude from a front surface of the heating assembly.

11. The reflow soldering system according to claim 1 further comprising one or more inlet ports for introducing a gas into a top end of the chamber and one or more outlet ports for exhausting the gas from a bottom end of the chamber.

12. The reflow soldering system according to claim 1 further comprising:

wherein the housing comprises a first member and a second member that are movable relative to one another to alter the housing between: (1) an open state in which a passageway into the chamber is formed for loading and unloading substrates from the chamber; and (2) a closed state in which the passageway is closed; and a second actuator unit operably coupled to the control unit, the control unit configured to alter the first and second members of the housing between the closed state and the open state using the second actuator unit.

13. A reflow soldering system comprising:

a housing comprising a chamber that extends from a bottom end to a top end along a longitudinal axis;

a support member supporting a substrate within the chamber;
a heating assembly located within the chamber in a fixed position on a first side of the substrate and configured to heat the substrate during a reflow soldering process;
a cooling assembly axially spaced apart from the heating assembly in a fixed position on a second side of the substrate and configured to cool the substrate during the reflow soldering process without directly contacting the substrate;
a first actuator unit operably coupled to the support member; and
a control unit operably coupled to the first actuator unit to move the substrate relative to the heating and cooling assemblies in opposite directions parallel to the longitudinal axis using the first actuator unit;
wherein the heating and cooling assemblies are spaced apart by an axial space, the substrate being located within the axial space during an entirety of a reflow soldering process, and wherein during the reflow soldering process the first actuator unit is configured to move the support member in: (1) a first direction whereby the substrate moves away from the heating assembly and towards the cooling assembly; and (2) a second direction that is opposite to the first direction whereby the substrate moves away from the cooling assembly and towards the heating assembly, and wherein the substrate is located closer to the cooling assembly than to the heating assembly during a cooling stage of the reflow soldering process; and
wherein the first actuator unit is configured to move the support member between a lower-most position whereby the substrate is located in a lower portion of the chamber adjacent to the heating assembly and an upper-most position whereby the substrate is located in an upper portion of the chamber adjacent to the cooling assembly.

14. The reflow soldering system according to claim 13 wherein the longitudinal axis of the chamber intersects the heating assembly and the cooling assembly.

15. The reflow soldering system according to claim 1 wherein there is no cooling assembly located on the same side of the substrate as the heating assembly.

16. The reflow soldering system according to claim 1 wherein the substrate is located in a space defined between the heating assembly and the cooling assembly during an entirety of the reflow soldering process.

17. The reflow soldering system according to claim 13 wherein the substrate is located in a space defined between the heating assembly and the cooling assembly during an entirety of the reflow soldering process.

18. A reflow soldering system comprising:
a housing comprising a chamber that extends from a bottom end to a top end along a longitudinal axis;
a support member supporting a substrate within the chamber;
a heating assembly located within the chamber on a first side of the substrate;
a cooling assembly axially spaced apart from the heating assembly and located on a second side of the substrate so that the substrate is positioned between the heating and cooling assemblies;
a first actuator unit operably coupled to the support member;
a control unit operably coupled to the first actuator unit to move the support member and the substrate relative to the heating and cooling assemblies in opposite directions parallel to the longitudinal axis using the first actuator unit; and
wherein during a solder reflow process the substrate is positioned adjacent to the heating assembly for a first pre-determined period of time, and wherein upon expiration of the first pre-determined period of time the first actuator unit moves the support member and the substrate vertically upward within the chamber away from the heating assembly and towards the cooling assembly.

* * * * *